(12) United States Patent
Yue et al.

(10) Patent No.: US 11,437,301 B2
(45) Date of Patent: Sep. 6, 2022

(54) DEVICE WITH AN ETCH STOP LAYER AND METHOD THEREFOR

(71) Applicant: NXP USA, INC., Austin, TX (US)

(72) Inventors: Yuanzheng Yue, Chandler, AZ (US); James Allen Teplik, Mesa, AZ (US); Bruce McRae Green, Gilbert, AZ (US); Fred Reece Clayton, Mesa, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/071,446

(22) Filed: Oct. 15, 2020

(65) Prior Publication Data

US 2022/0122903 A1 Apr. 21, 2022

(51) Int. Cl.
*H01L 23/48* (2006.01)
*H01L 29/40* (2006.01)
*H01L 21/768* (2006.01)
*H01L 29/66* (2006.01)
*H01L 29/778* (2006.01)

(52) U.S. Cl.
CPC ...... *H01L 23/481* (2013.01); *H01L 21/76898* (2013.01); *H01L 29/401* (2013.01); *H01L 29/66462* (2013.01); *H01L 29/7786* (2013.01)

(58) Field of Classification Search
CPC ............. H01L 23/481; H01L 21/76898; H01L 29/66462; H01L 29/7786
See application file for complete search history.

(56) References Cited

U.S. PATENT DOCUMENTS

| 7,892,974 | B2 | 2/2011 | Ring et al. |
| 8,609,538 | B2 | 12/2013 | Hill et al. |
| 2012/0175777 | A1* | 7/2012 | Hill ........................ H01L 23/481 257/753 |
| 2013/0288401 | A1* | 10/2013 | Matsuura ................ H01L 22/10 438/14 |
| 2015/0099358 | A1 | 4/2015 | Chen et al. |
| 2016/0079343 | A1* | 3/2016 | Liu ........................ H01L 23/50 438/396 |
| 2016/0343809 | A1* | 11/2016 | Green ............... H01L 29/66462 |
| 2020/0273780 | A1* | 8/2020 | Park ...................... H01L 23/481 |

OTHER PUBLICATIONS

Ruan, Ju-Ai, et al; "Backside Via Process of GaN Device Fabrication;" Proceedings of the International Conference on Compound Semiconductor Manufacturing Technology; CSMANTECH Conference; Apr. 23-26, 2012, Boston, Massachusetts.

* cited by examiner

*Primary Examiner* — Joseph C. Nicely
(74) *Attorney, Agent, or Firm* — Bruce M. Green

(57) ABSTRACT

A device includes a substrate, an insulating layer that includes an etch stop layer formed over an upper surface of the substrate, a first conductive region formed over the insulating layer, and an opening formed within the substrate that extends from a lower surface of the substrate, through the upper surface of the substrate, and through at least a portion the insulating layer, terminating on the first conductive region. A method for forming the device includes forming the substrate, forming the insulating layer that includes the etch stop layer over the upper surface of the substrate, forming a first conductive region over the insulating layer; and forming an opening within the substrate that extends from the lower surface of the substrate, through the upper surface of the substrate, and through at least a portion the insulating layer, terminating on the first conductive region formed over the insulating layer.

18 Claims, 13 Drawing Sheets

DEVICE WITH AN ETCH STOP LAYER AND METHOD THEREFOR

TECHNICAL FIELD

Embodiments of the subject matter described herein relate generally to devices, including devices that include through-wafer vias.

BACKGROUND

Semiconductor devices find application in a wide variety of electronic components and systems. Moreover, useful devices for radio frequency (RF), microwave, and millimeter wave applications may employ through-wafer vias with connections to top-side pads for low inductance connections from the backside to the frontside of a wafer. In particular, gallium nitride (GaN) devices on silicon carbide (SiC) substrates allow high frequency and high power operation. However, SiC is difficult and time-consuming to etch, and in some cases, high-power SiC etches may lead to over-etching and even etching through top-side metallization used to contact through-wafer vias. Thus, structures and methods that allow through-wafer vias with robust etch properties are desired.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1A:
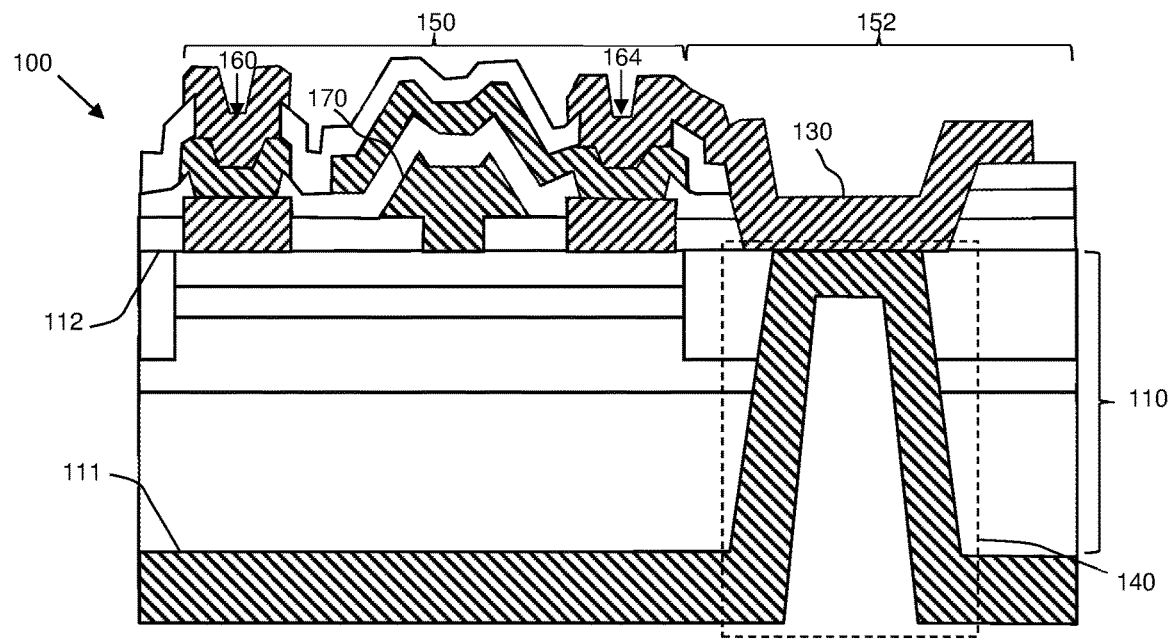
FIGS. 1A and 1B are cross sectional side views of conventional devices.

Embodiments of a device are described herein. In one aspect, an embodiment of a device may include a substrate that includes an upper surface and a lower surface. The device may also include an insulating layer that includes an etch stop layer formed over the upper surface of the substrate, according to an embodiment. In an embodiment, a first conductive region may be formed over the insulating layer. An opening may be formed within the substrate that extends from the lower surface of the substrate, through the upper surface of the substrate, and through at least a portion the insulating layer, terminating on the first conductive region, according to an embodiment. In an embodiment, a second conductive region may be formed within the opening. According to an embodiment, a terminating edge of the insulating layer may be formed laterally adjacent the opening and may define a protection region proximate the opening. In an embodiment, the insulating layer may include a first dielectric layer. The first dielectric layer may include the etch stop layer, according to an embodiment. According to an embodiment, the insulating layer may include a second dielectric layer formed over the first dielectric layer and a third dielectric layer formed over the second dielectric layer. The third dielectric layer may include the etch stop layer, according to an embodiment. In an embodiment, at least a portion of the first dielectric layer may be removed within the opening. In an embodiment, the etch stop layer may include one or more of aluminum nitride, aluminum oxide, silicon nitride, silicon oxynitride, silicon dioxide, tetraethyl orthosilicate, and indium tin oxide. In an embodiment, the device may include an active region formed proximate the upper surface of the substrate and laterally adjacent the opening. A first current-carrying electrode may be formed within the active region and coupled to the active region, according to an embodiment. In an embodiment, a second current-carrying electrode may be formed within the active region, laterally adjacent the first current-carrying electrode, and coupled to the active region. In an embodiment, a control electrode may be formed over the substrate and coupled to the active region between the first current-carrying electrode and the second current-carrying electrode. In an embodiment, a portion of the insulating layer containing the etch stop layer may be formed within the active region. In other embodiments, the portion of the insulating layer containing the etch stop layer may be formed outside the active region.

In another aspect, an embodiment may include a transistor device that includes a substrate that includes an upper surface and a lower surface. An insulating layer that includes an etch stop layer may be formed over the upper surface of the substrate, according to an embodiment. In an embodiment, a first conductive region may be formed over the insulating layer. An opening may be formed within the substrate that extends from the lower surface of the substrate, through the upper surface of the substrate, and through at least a portion the insulating layer, terminating on the first conductive region formed over the insulating layer, according to an embodiment. In an embodiment, a second conductive region may be formed within the opening.

In an embodiment, an active region may be formed proximate the upper surface of the substrate and laterally adjacent the opening. A first current-carrying electrode may be formed within the active region and coupled to the active region, according to an embodiment. In an embodiment, a second current-carrying electrode may be formed within the active region, laterally adjacent the first current-carrying electrode, and coupled to the active region. In an embodiment, a control electrode may be formed over the substrate and coupled to the active region between the first current-carrying electrode and the second current-carrying electrode. At least a portion of the insulating layer may be formed over the active region, according to an embodiment. In an embodiment, the portion of the insulating layer containing the etch stop layer may be formed outside the active region.

Yet another aspect of the inventive subject matter may include a method of forming a device. According to an embodiment, the method may include forming a substrate that includes an upper surface and a lower surface. An embodiment of the method may further include forming an insulating layer that includes an etch stop layer over the upper surface of the substrate. An embodiment of the method may include forming a first conductive region over the insulating layer and forming an opening within the substrate that extends from the lower surface of the substrate, through the upper surface of the substrate, and through at least a portion the insulating layer, terminating on the first conductive region formed over the insulating layer. An embodiment of the method may include forming a second conductive region within the opening. An embodiment of the method may include forming a transistor within and over the substrate. An embodiment of the method may further include forming an active region proximate the upper surface of the substrate and laterally adjacent the opening, forming a first current-carrying electrode within the active region and coupled to the active region, forming a second current-carrying electrode within the active region, laterally adjacent the first current-carrying electrode, and coupled to the active region, and forming a control electrode over the substrate and coupled to the active region between the first current-carrying electrode and the second current-carrying electrode. Some embodiments of the method may include forming the insulating layer from one or more of aluminum nitride, aluminum oxide, silicon nitride, silicon oxynitride, silicon dioxide, tetraethyl orthosilicate, and indium tin oxide. According to other embodiments, at least a portion of the insulating layer may be formed within the active region. According to an embodiment, a terminating edge of the insulating layer may be formed outside the active region.

FIG. 1A is a cross sectional side view of a conventional device 100. The conventional device 100 may include a substrate 110 that includes an upper surface 112 and a lower surface 111. A through-wafer via 140 may be formed within the substrate 110. A via pad 130 may be formed over the through-wafer via 140. The conventional device 100 may include one or more transistors or other devices within an active region 150 formed proximate the upper surface 112 of the substrate 110 and laterally adjacent the through-wafer via 140 and the via pad 130. A transistor formed in the active region 150 may include a source electrode 160 and a drain electrode 164 and is coupled to the active region 150. In a conventional device, a gate electrode 170 may be formed over the substrate 110 and coupled to the active region 150 between the source electrode 160 and the drain electrode 164.

Figure 1B:
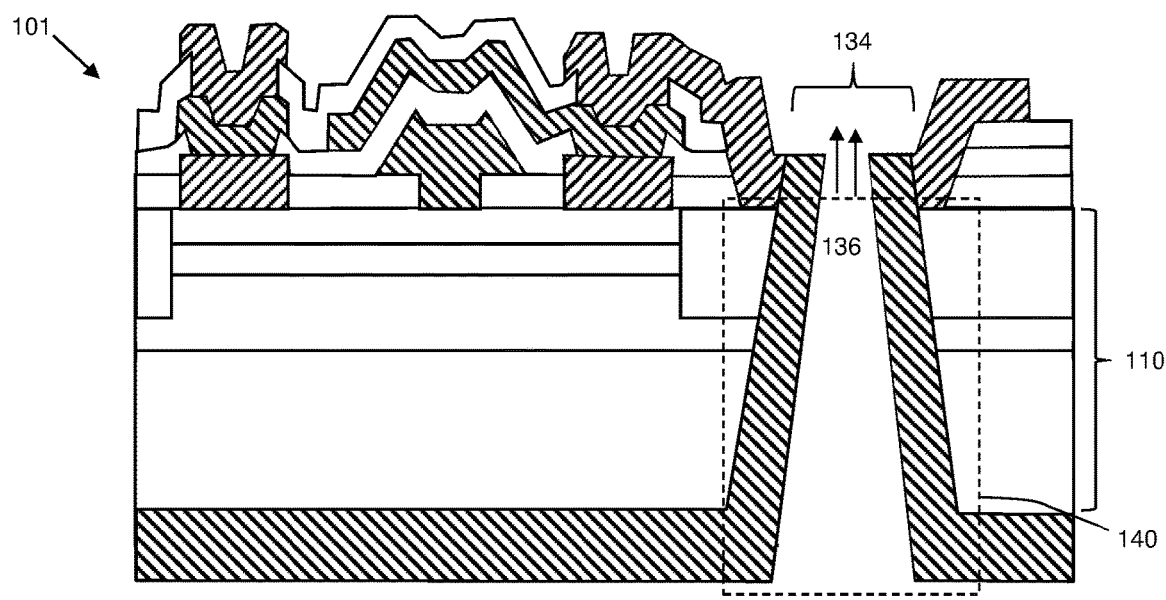

FIG. 1B depicts a cross sectional side view of a conventional device 101, that in some situations, may suffer from an over-etch opening 134 of the via pad 130 during the formation of the through-wafer via 140. This over-etch opening 134 may occur when the etch of the substrate 110 (e.g. gallium nitride on silicon carbide) completes too soon before the end of the etch, allowing the via pad 130 to etch completely through. Such a situation is undesirable because the over-etch opening 134 may allow an ingress 136 of solder or other materials that may be used to bond the die containing conventional device 100 to a heatsink to flow out of the over-etch opening 134. The ingress 136 of solder or other materials used for die attach may interfere with the operation or cause premature failure of the conventional device 100.

Figures 2, 3:
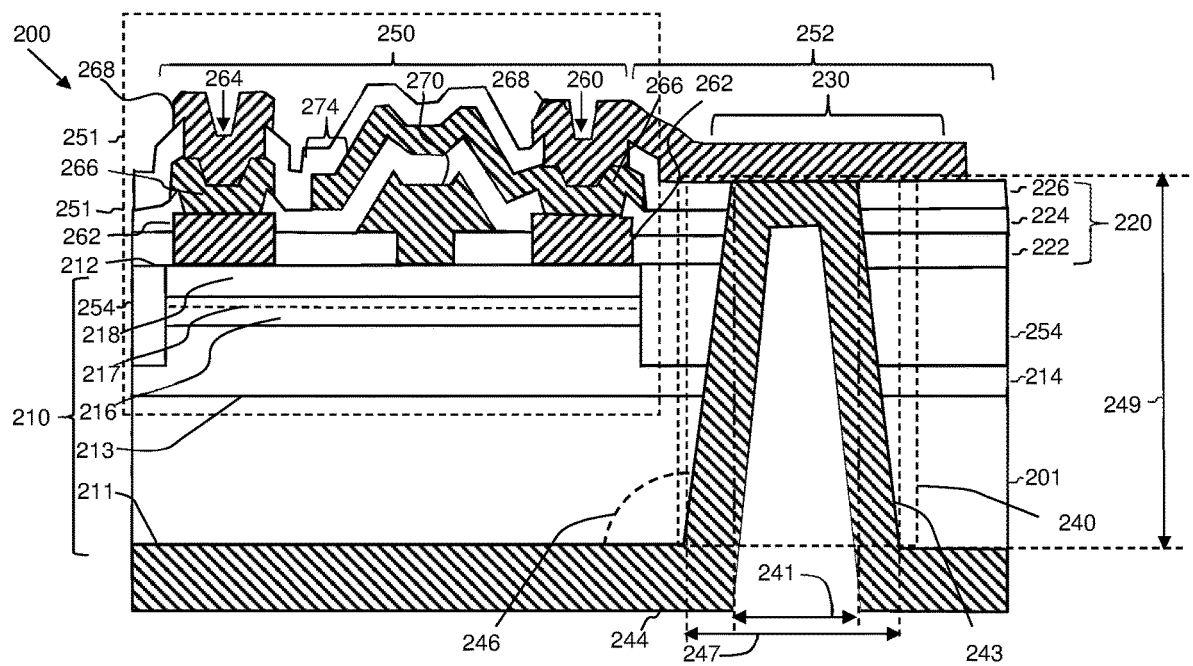
FIG. 2 is a cross sectional side view of a device in accordance with an embodiment.
FIG. 3 is a cross sectional side view of a device in accordance with an embodiment.

FIG. 2 depicts a cross sectional side view of a device 200 in accordance with an embodiment. Embodiments of the device 200 may address the shortcomings of the conventional device 100 of FIG. 1. Specifically, device 200 provides an etch stop within an insulating layer 220 that may prevent the formation of the over etch opening 134 in the conventional device 101 of FIG. 1B. In an embodiment, the device 200 may include a substrate 210 that includes an upper surface 212 and a lower substrate surface 211. The device 200 may also include an insulating layer 220 with an etch stop layer formed over the upper surface 212 of the substrate 210, according to an embodiment. In an embodiment, a via pad 230 (i.e. "first conductive region") may be formed over the insulating layer 220. In an embodiment, a through-wafer via 240 (i.e. "opening") may be formed within the substrate 210. According to an embodiment, a back metal layer 244 (i.e. "second conductive region") may be formed within the through wafer via 240 and on the lower surface 211 of the substrate 210. In an embodiment, the device 200 may include a transistor structure 251 and/or other device(s) (embodiment not shown) formed within an active region 250 formed proximate the upper surface 212 of the substrate 210 and laterally adjacent the through wafer via 240. The transistor structure 251 may be formed with a portion of the dielectric layers that comprise the insulating layer 220 and may include a source electrode 260 (i.e. "first current-carrying electrode") and a drain electrode 264 (i.e. "second current-carrying electrode"), both of which may be formed over and within the substrate 210, within the active region 250. The source electrode 260 and drain electrode 264 may be formed laterally adjacent the source electrode 260, within the active region 250, and may be coupled to a channel 217 formed within the substrate 210, according to an embodiment. In an embodiment, a gate electrode 270 (i.e. "control electrode") may be formed over the substrate 210 and coupled to the active region 250 between the source electrode 260 and the drain electrode 264.

In an embodiment, the substrate 210 may include an upper surface 212, a lower substrate surface 211, a host substrate 201, a buffer layer 214, a channel layer 216, a channel 217, and a barrier layer 218. In an embodiment, the host substrate 201 may include an upper surface 213 and may be formed from silicon carbide (SiC). In other embodiments, host substrate 201 may include other materials such as sapphire, silicon (Si), gallium nitride (GaN), aluminum nitride (AlN), diamond, boron nitride (BN), poly-SiC, silicon on insulator, gallium arsenide (GaAs), indium phosphide (InP), and other substantially insulating or high resistivity materials. The buffer layer 214 may be formed on the upper surface 213 of host substrate 201. The buffer layer 214 may include one or more group III-N semiconductor layers and is supported by host substrate 201. The buffer layer 214 may include a multi-layer structure, wherein each of the semiconductor layers of buffer layer 214 may include an epitaxially grown group III nitride layer, for example. The epitaxially grown group-III nitride layers that make up buffer layer 214 may include nitrogen (N)-polar (i.e. N-face) or gallium (Ga)-polar (i.e. Ga-face) material, for example. In other embodiments, the semiconductor layer(s) of the buffer layer 214 may not be epitaxially grown. In still other embodiments, the semiconductor layer(s) of the buffer layer 214 may include Si, GaAs, InP, or other suitable materials.

The buffer layer 214 may include at least one AlGaN mixed crystal layer having a composition denoted by $Al_XGa_{1-X}N$ with an aluminum mole fraction, X, that can take on values between 0 and 1. The total thickness of buffer layer 214 with all of its layers may be between about 200 angstroms and about 100,000 angstroms although other thicknesses may be used. A limiting X value of 0 yields pure GaN while a value of 1 yields pure aluminum nitride (AlN). In an embodiment, the buffer layer 214 may include a nucleation region comprised of AlN. The nucleation region starts at the interface between the host substrate 201 and buffer layer 214, and extends about 100 angstroms to about 2000 angstroms into buffer layer 214. The buffer layer 214 may include additional $Al_XGa_{1-X}N$ layers formed over the nucleation region. The thickness of the additional $Al_XGa_{1-X}N$ layer(s) may be between about 100 angstroms and about 50,000 angstroms though other thicknesses may be used. In an embodiment, the additional $Al_XGa_{1-X}N$ layer(s) may be configured as GaN layer(s) (X=0) where the $Al_XGa_{1-X}N$ layer(s) are not intentionally doped (NID). Alternatively, the additional $Al_XGa_{1-X}N$ layer(s) may be configured as one or more GaN layers where the one or more GaN layers are intentionally doped with dopants that may include iron (Fe), chromium (Cr), carbon (C) or other suitable dopants that render buffer layer 214 substantially insulating or high resistivity. The dopant concentration may be between about $10^{17}$ cm$^{-3}$ and $10^{19}$ cm$^{-3}$ though other higher or lower concentrations may be used. The additional $Al_XGa_{1-X}N$ layers may be configured with X=0.01 to 0.10 where the $Al_XGa_{1-X}N$ is NID or, alternatively, where the $Al_XGa_{1-X}N$ is intentionally doped with Fe, Cr, C, a combination of these, or other suitable dopant species. In other embodiments, the additional layers may be configured as a superlattice where the additional layers include a series of alternating NID or doped $Al_XGa_{1-X}N$ layers where the value of X takes a value between 0 and 1. In still other embodiments, buffer layer 214 may include one or more indium gallium nitride (InGaN) layers, with composition denoted $In_YGa_{1-Y}N$, where Y, the indium mole fraction, may take a value between 0 and 1. The thickness of the InGaN layer(s) may be between about 10 angstroms and about 2000 angstroms though other thicknesses may be used.

In an embodiment, the channel layer 216 may be formed over buffer layer 214. The channel layer 216 may include one or more group III-N semiconductor layers and is supported by buffer layer 214. The channel layer 216 may include an $Al_XGa_{1-X}N$ layer where X takes on values between 0 and 1. In an embodiment, the channel layer 216 is configured as GaN (X=0) although other values of X may be used without departing from the scope of the inventive subject matter. The thickness of the channel layer 216 may be between about 50 angstroms and about 10,000 angstroms, though other thicknesses may be used. The channel layer 216 may be NID or, alternatively, may include Si, Ge, C, Fe, Cr, or other suitable dopants. The dopant concentration may be between about $10^{16}$ and about $10^{19}$ cm$^{-3}$ though other higher or lower concentrations may be used. In other embodiments, channel layer 216 may include NID or doped $In_YGa_{1-Y}N$, where Y, the indium mole fraction, may take a value between 0 and 1.

The barrier layer 218 may be formed over the channel layer 216, in accordance with an embodiment. The barrier layer 218 may include one or more group III-N semiconductor layers and may be supported by the channel layer 216. The barrier layer 218 may have a larger bandgap and/or larger spontaneous polarization than the channel layer 216 and, when the barrier layer 218 is over channel layer 216, the channel 217 may be created in the form of a two dimensional electron gas (2-DEG) within channel layer 216 adjacent the interface between the channel layer 216 and the barrier layer 218. In addition, tensile strain between the barrier layer 218 and channel layer 216 may cause additional piezoelectric charge to be introduced into the 2-DEG and the channel 217. The barrier layer 218 may include a multi-layer structure, where the first layer of the barrier layer 218 may include at least one NID $Al_XGa_{1-X}N$ layer where X takes on values between 0 and 1. In some embodiments, X may take a value of 0.1 to 0.35, although other values of X may be used. The thickness of the first layer of the barrier layer 218 may be between about 50 angstroms and about 1000 angstroms though other thicknesses may be used. The barrier layer 218 may be NID or, alternatively, may include Si, Ge, C, Fe, Cr, or other suitable dopants. The dopant concentration may be between about $10^{16}$ and $10^{19}$ cm$^{-3}$ though other higher or lower concentrations may be used. There may be an additional AlN interbarrier layer (not shown) formed between the channel layer 216 and the barrier layer 218, in some embodiments. The AlN interbarrier layer may introduce additional spontaneous and piezoelectric polarization, increasing the channel charge and improving the electron confinement of the resultant 2-DEG that forms the channel 217. In other embodiments, the barrier layer 218 may include one or more indium aluminum nitride (InAlN) layers, denoted $In_YAl_{1-Y}N$, where Y, the indium mole fraction, may take a value between about 0.1 and about 0.2 though other values of Y may be used. In the case of using InAlN to form the barrier layer 218, the thickness of the barrier layer 218 may be between about 50 angstroms and about 2000 angstroms though other thicknesses may be used. In the case of using InAlN to form the barrier layer 218, the InAlN may be NID or, alternatively, may include Si, Ge, C, Fe, Cr, or other suitable dopants. The dopant concentration may be between about $10^{16}$ cm$^{-3}$ and about $10^{19}$ cm$^{-3}$ though other higher or lower concentrations may be used.

A cap layer (not shown) may be formed over the barrier layer 218. The cap layer presents a stable surface for the substrate 210 and serves to protect the upper surface 212 from chemical and environmental exposure incidental to wafer processing. The cap layer may include one or more group III-N semiconductor layers and is supported by barrier layer 218. In an embodiment, the cap layer includes GaN. The thickness of the cap layer may be between about 5 angstroms and about 100 angstroms though other thicknesses may be used. The cap layer may be NID or, alternatively, may include Si, Ge, C, Fe, Cr, or other suitable dopants. The dopant concentration may be between about $10^{16}$ cm$^{-3}$ and $10^{19}$ cm$^{-3}$ though other higher or lower concentrations may be used.

In an embodiment, the insulating layer 220 may be formed over the substrate 210 and may include one or more dielectric layers. The insulating layer 220 may include a first dielectric layer 222, a second dielectric layer 224 formed over the first dielectric layer 222, and a third dielectric layer 226 formed over the second dielectric layer 224, according to an embodiment. In an embodiment, one or more of the first dielectric layer 222, the second dielectric layer 224, and the third dielectric layer 226 may include an etch stop layer. As used herein, an "etch stop layer" refers to a material layer that has selectivity to an etchant of the material used to etch the host substrate 201 or at least one of the buffer layer 214, the channel layer 218, and the barrier layer 218. According to an embodiment, the insulating layer 220 may include a second dielectric layer 224 formed over the first dielectric layer 222. The second dielectric layer 224 may include an etch stop layer, according to an embodiment. In an embodiment, at least a portion of the first dielectric layer 222 may be removed within the through-wafer via 240. Without departing from the scope of the inventive subject matter, the insulating layer 220 may be formed from more than three dielectric layers (e.g. a fourth dielectric layer may be formed over the third dielectric layer, a fifth dielectric layer may be formed over the third dielectric layer and so forth). In an embodiment, the etch stop material used to form an etch stop in the first dielectric layer 222 or the second dielectric layer 224 may include one or more of aluminum nitride (AlN), aluminum oxide ($Al_2O_3$), silicon nitride ($Si_XN_Y$), silicon oxynitride (SiON), silicon dioxide ($SiO_2$), tetraethyl orthosilicate (TEOS), and indium tin oxide (ITO). As used herein, $Si_XN_Y$ refers to silicon nitride where X and Y refer to the relative proportion of silicon atoms and nitrogen atoms. The proportion of silicon to nitrogen may vary, according to an embodiment. In an embodiment, the ratio of silicon to nitrogen may be 3 to 4 to form stoichiometric silicon nitride (e.g. $Si_3N_4$). In other embodiments, other values of X and Y may be used to achieve a Si-rich (e.g. X>3, Y<4) or Si-lean film (e.g. X<3, Y>4). In other embodiments, the first dielectric layer 222, the second dielectric layer 224, and the third dielectric layer 226 may include thermally conductive materials such as diamond, poly-diamond, AlN, BN, SiC, or other high thermal conductivity substantially insulating or semi insulating materials. In an embodiment, these materials may be resistant to an etchant of the substrate 210. In an embodiment, each of the first dielectric layer 222, the second dielectric layer 224, and the third dielectric layer 226 may have thickness values in the range of about 100 angstroms to about 10,000 angstroms, though other thickness values may be used. In other embodiments, each of the first dielectric layer 222, the second dielectric layer 224, and the third dielectric layer 226 may have thickness values in the range of about 500 angstroms to about 5,000 angstroms, though other thickness values may be used. In an embodiment, one or more of the first dielectric layer 222, the second dielectric layer 224, and the third dielectric layer 226 may be formed over the active region 250 and the isolation region 252. In other embodiments, one or more of the first dielectric layer 222, the second dielectric layer 224, and the third dielectric layer 226 may be formed only over the active region 250. In these other embodiments, the dielectric layer containing the etch stop layer may be formed within the active region 250 and the isolation region 252. For example, the first dielectric layer 222 may be formed only within the active region while one or more of the second dielectric layer 224 and the third dielectric layer 226 may be formed over the first dielectric layer 222 in the active region and may also be formed in the isolation region (embodiment not shown). In still other embodiments, one or more of the first dielectric layer 222, the second dielectric layer 224, and the third dielectric layer 226 may be formed only over the isolation region 252.

In an embodiment, at least a portion of the insulating layer 220 may be formed within the active region and may be used to form transistor structure 251. In other embodiments, and as described in connection with device 300 of FIG. 3, at least a portion of the insulating layer 220 may be formed outside the active region.

The via pad 230 (first conductive layer) may be formed from one or more refractory metal layers and high conductivity metal layers formed over the insulating layer 220, according to an embodiment. In an embodiment, the first refractory metal layer may be formed over the insulating layer 220 and may contact the insulating layer 220. In an embodiment, the first refractory metal layer may include Ni, Pt, or other suitable metal(s) that are resistant to the etch process used to form the through-wafer via 240. In an embodiment, the first refractory metal layer may be used as an adhesion layer. In some embodiments, the refractory metal layer may include one or more layers using the aforementioned materials. In an embodiment, the refractory metal layer may have a thickness between about 500 angstroms and about 1000 angstroms. In other embodiments, the refractory metal layer may have a thickness between about 500 angstroms and 100000 angstroms, though other thicker and thinner layers may be used. In an embodiment, the high conductivity metal layer may be formed over the refractory metal layer and may include one or more of gold (Au), nickel (Ni), platinum (Pt), aluminum (Al), copper (Cu), titanium (Ti), silver (Ag), and Cr. In some embodiments, the high conductivity metal layer may include one or more layers using the aforementioned materials (embodiment not shown). In an embodiment, the high conductivity metal layer may have a thickness between about 5000 angstroms and about 40000 angstroms. In other embodiments, the high conductivity metal layer may have a thickness between about 500 angstroms and 100000 angstroms, though other thicker and thinner layers may be used.

The through-wafer via 240 (opening) formed in the substrate 210 may extend from the lower substrate surface 211, through the upper substrate surface 212, and through at least a portion of the insulating layer 220, terminating on the via pad 230, according to an embodiment. In an embodiment, the through-wafer via 240 may include an etched opening having a via sidewall 243 formed in the substrate 210 and the insulating layer 220. According to an embodiment, the through-wafer via 240 is partially defined by an inner via dimension 241 that defines the width of the opening of the through-wafer via 240 at the upper surface of the insulating layer 220, and the via sidewall 243 subtended by the lower substrate surface 211 at a via sidewall angle 246, with an outer via dimension 247 that defines the width of the opening of the through-wafer via 240 at the lower substrate surface 211. The inner via dimension 241 may be defined by etching into the substrate 210 and the insulating layer 220. In an embodiment, the inner via dimension 241 may be between about 5 microns and about 1000 microns although other suitable dimensions may be used. The via sidewall angle 246 subtended by the via sidewall 243 and the lower substrate surface 211 may be between about 85 degrees and about 150 degrees in an embodiment. In other embodiments, the via sidewall angle 246 may be between about 90 degrees and about 110 degrees, though other angles may be used. The outer via dimension 247 may be defined by etching into the substrate 210 and may be between about 5 microns and about 1000 microns though other suitable dimensions may be used, according to an embodiment. A via height 249, partially defined by the combined thickness of the substrate 210 and the insulating layer 220 may be between about 10 and about 150 microns though other suitable dimensions may be used. In other embodiments, the via height 249 may be between about 100 and 2000 microns, though other suitable dimensions may be used.

In an embodiment, the back metal layer 244 (second conductive region) may be coupled to the via pad 230 through the through-wafer via 240. The back metal layer 244 may include an adhesion layer that contacts the lower substrate surface 211 and a primary conductive layer that contacts the adhesion layer. The adhesion layer may be selected from one or more of Ti, titanium tungsten (TiW), Cr, or other suitable low-stress materials. The adhesion layer may have a thickness between about 50 angstroms and about 2 microns, although other thicknesses may be used. The conductive layer may be selected from one or more of Au, Al, Ag, Cu, a combination of these, or other conductive material. The conductive layer may have a thickness of between about 0.1 micron and about 50 microns though other thicknesses may be used.

In an embodiment, the transistor structure 251 may be formed with the active region 250 and may be formed proximate the upper substrate surface 212 and laterally adjacent the through-wafer via 240. A source electrode 260 (i.e. "first current-carrying electrode") may be formed within the active region 250 and electrically coupled to the channel 217, according to an embodiment. In an embodiment, a drain electrode 264 (i.e. "second current-carrying electrode") may be formed within the active region 250, laterally adjacent the source electrode 260, and electrically coupled to the active region 250. In an embodiment, a gate electrode 270 (i.e. "control electrode") may be formed over the substrate 210 and electrically coupled to the channel 217 between the source electrode 260 and the drain electrode 264 within the active region 250. At least a portion of the insulating layer 220 may be formed over the active region 250, according to an embodiment.

In an embodiment, the active region 250 may be formed within the substrate 210. One or more isolation region 252 may be formed within the substrate 210 to define the active region 250 proximate the upper surface 212, according to an embodiment. The isolation region 252 may be formed via an implantation procedure configured to damage the epitaxial and/or other semiconductor layers to create high resistivity regions 254 of the substrate 210, rendering the substrate 210 high resistivity or semi-insulating in high resistivity regions 254 while leaving the crystal structure intact in the active region 250. In other embodiments (not shown), isolation region 252 may be formed by removing one or more of the epitaxial and/or other semiconductor layers of the substrate 210 in areas corresponding to the isolation region 252, thus removing the channel 217 in the isolation region 252, rendering the remaining layers of the substrate 210 semi-insulating and leaving behind active region 250 "mesas" surrounded by high resistivity or semi-insulating isolation regions 252.

Figure 7:
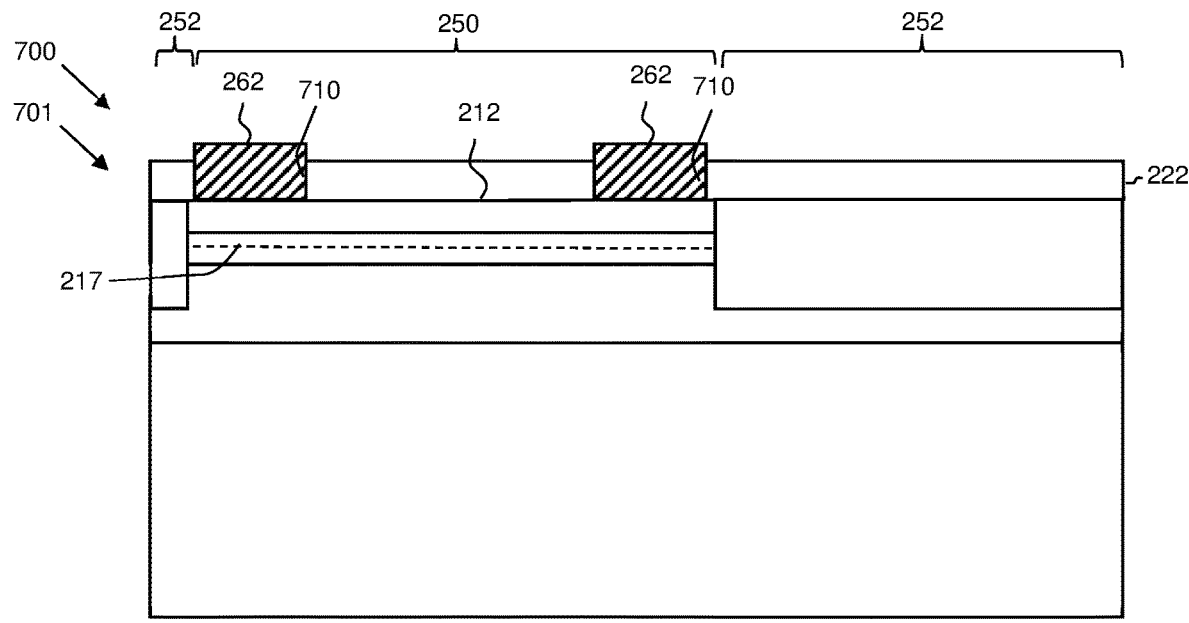

In an embodiment, the source electrode 260 and the drain electrode 264 (first and second current-carrying electrodes) may be formed by connections through first and second interconnect metal 266 and 268 to ohmic contacts 262 electrically coupled to the substrate 210. In an embodiment, the ohmic contacts 262 may be formed in openings in the first dielectric layer 222. The ohmic contacts 262 may be electrically coupled to the channel 217 through the upper substrate surface 212 and the barrier layer 218. In other embodiments, the ohmic contacts 262 may be recessed through the upper substrate surface 212 and extend partially into or completely through the barrier layer 218, increasing the electrical coupling of the ohmic contacts 262 to the channel 217 through the barrier layer 218. In still other embodiments, ohmic contact regions may be formed by implanting a dopant species (e.g. Si) into the substrate 210. As will be described later, in an embodiment of a method for forming the device 200, as depicted in FIG. 7 and described in conjunction with step 700 below, low work function or other suitable materials may be combined with highly conductive materials in a metal stack to form ohmic contacts 262 for low resistance contacts to the channel 217, according to an embodiment. Accordingly, a multi-stack metal layer (e.g. Ti, Al and or other suitable materials) may be deposited and annealed to form the ohmic contacts 262.

Figure 8:
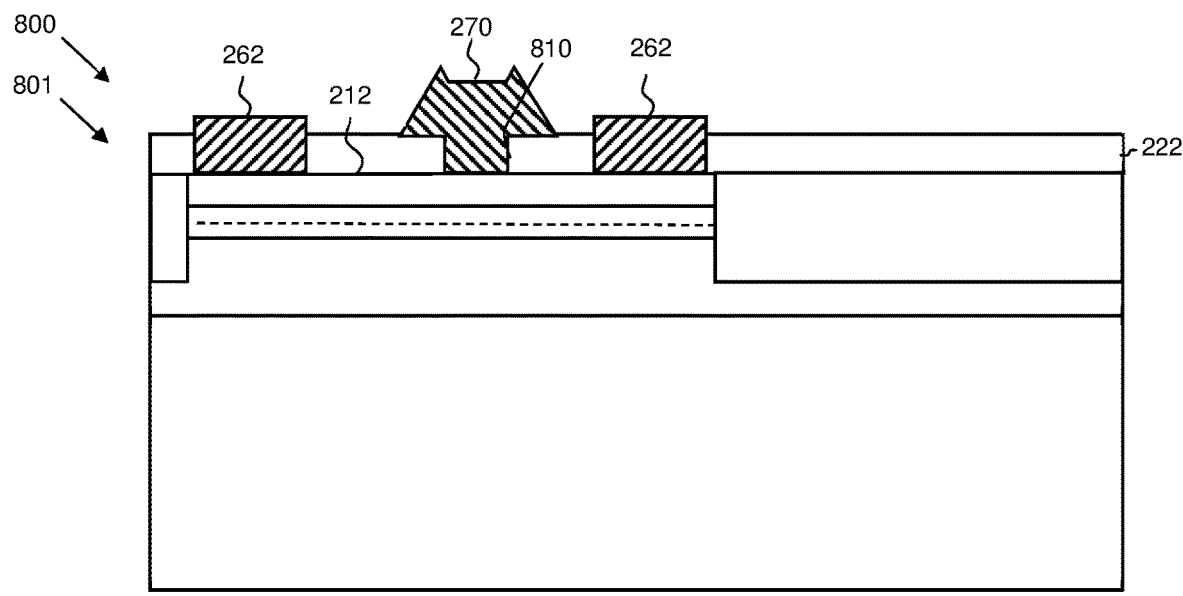

In an embodiment, the gate electrode 270 (control electrode) may be formed over the substrate 210 in the active region 250. The gate electrode 270 may be electrically coupled to the channel 217 through the upper substrate surface 212 and the barrier layer 218. Changes to the electric potential on gate electrode 270 may shift the quasi Fermi level for the barrier layer 218 compared to the quasi Fermi level for the channel layer 216 and thereby modulate the electron concentration in the channel 217 within the portion of the substrate 210 under the gate electrode 270. In an embodiment, the gate electrode 270 may be configured as a Schottky gate and may be formed over and directly in contact with the upper substrate surface 212 using a Schottky material layer and a conductive metal layer. A conductive, low stress metal may be deposited over the Schottky material layer to form the gate electrode 270, according to an embodiment. The gate electrode 270 may have a T-shaped cross section with a vertical stem over substrate 210 and a wider portion over the vertical stem and in contact with the first dielectric layer 222, according to an embodiment. In other embodiments (not shown), the gate electrode 270 may have a square cross-sectional shape. In other embodiments, the gate electrode 270 may be recessed through the upper substrate surface 212 and may extend partially into the barrier layer 218, increasing the electrical coupling of gate electrode 270 to channel 217 through the barrier layer 218. As will be described later, in an embodiment of a method for forming gate electrode 270, as depicted in FIG. 8 and described in conjunction with step 800 below, Schottky or other suitable materials may be combined with highly conductive materials in a metal stack to form a gate electrode 270 for a low losses in gate electrode 270 electrically coupled to the channel 217, according to an embodiment. In other embodiments, the gate electrode 270 may be formed over a gate dielectric or gate oxide forming a metal-insulator-semiconductor (MIS) junction or metal oxide semiconductor (MOS) junction, electrically coupled to the channel 217 through the gate dielectric or gate oxide layer.

In an embodiment, a first interconnect metal 266 may be electrically coupled to the source ohmic contact 262. In an embodiment, the first interconnect metal 266 may be formed over and electrically coupled to the ohmic contacts 262 and may be electrically coupled to one or more of drain electrode 264, the source electrode 260, and/or gate electrode 270. In an embodiment, the first interconnect metal 266 may be extended over the gate electrode 270 to form a field plate region 274. In an embodiment, the field plate region 274 may include a conductive structure proximate the gate electrode 270 and may be formed over the first dielectric layer 222. The field plate region 274 may be electrically coupled to the source electrode 260. In other embodiments, the field plate region 274 may be electrically coupled to the gate electrode 264 (embodiment not shown). In still other embodiments, the first interconnect metal 266 may be used to form the via pad 230 (embodiment not shown). The first interconnect metal 266 may include an adhesion layer and a conductive layer in contact with the adhesion layer. The adhesion layer may be selected from one or more of Ti, TiW, Cr, or other suitable low-stress material(s). The adhesion layer may have a thickness between about 50 angstroms and about 10,000 angstroms, although other thicknesses may be used. The conductive layer may be selected from one or more of Au, Al, Ag, or Cu. The conductive layer may have a thickness of between about 0.1 and about 20 microns though other thicknesses may be used.

In an embodiment, a second interconnect metal 268 may be formed over the first interconnect metal 266 and may be electrically coupled to the source electrode 260 and the drain electrode 264. In an embodiment, the second interconnect metal 268 may be coupled to the first interconnect metal 266. In an embodiment, the second interconnect metal 268 may be formed over first interconnect metal 266 and the second dielectric layer 224 and electrically coupled to one or more of the drain electrode 264, the source electrode 260, and/or the gate electrode 270. In an embodiment, the second interconnect metal 268 may be used to form the via pad 230 (i.e. first conductive region). Electrical connection to the via pad 230 may include an electrical connection to the source electrode 260, according to an embodiment. In other embodiments, via pad 230 may be electrically coupled to drain electrode 264 or gate electrode 270 (embodiments not shown). The second interconnect metal 268 may include an adhesion layer and a primary conductive layer in contact with the adhesion layer. The adhesion layer may be selected from one or more of Ti, TiW, Cr, or other suitable low-stress material(s). The adhesion layer may have a thickness between about 50 angstroms and about 10,000 angstroms, although other thicknesses may be used. The conductive layer may be selected from one or more of Au, Al, Ag, or Cu. The conductive layer may have a thickness of between about 0.1 and about 20 microns, although other thicknesses may be used.

FIG. 3 is a cross sectional side view of a device in accordance with an embodiment. As is described in connection with the device 200 of FIG. 2, the device 300 may include an insulating layer 320, a via pad 330, a through-wafer via 340, an active region 350, a source electrode 360, a drain electrode 364, and a gate electrode 370 disposed over the substrate 310. These features are analogous in form and function of like numbered features of the device 200 of FIG. 2 (e.g. 210, 220, 230, 240, 250, 260, 265, 270), except with numbers that begin with "3". Thus, for the sake of brevity, the details of these features are not described in detail here.

The insulating layer 320 may be formed over the substrate 310 and may include a first dielectric layer 322 formed over the substrate 310, a second dielectric layer 324 formed over the first dielectric layer 322, a third dielectric layer 326 formed over the second dielectric layer 324, and a fourth dielectric layer 328 formed over the third dielectric layer 326 within a protection region 345, according to an embodiment. According to an embodiment, the portion of the insulating layer 320 that includes the etch stop layer may include the fourth dielectric layer 328 and may be formed laterally adjacent the through-wafer via 340, defining a protection region 345 proximate the through-wafer via 340. In an embodiment, the protection region 345 may be formed in a spacer region 347 and formed coplanar with one or more of the first dielectric layer 322, the second dielectric layer 324, and the third dielectric layer 326. The fourth dielectric layer 328 may be disposed within the spacer region 347, according to an embodiment. In an embodiment, the fourth dielectric layer 328 may contact the substrate 310 within the spacer region 347. The fourth dielectric layer 328 may extend from the spacer region 347 where it may contact the substrate 310 and overlap one or more of the first dielectric layer 322, the second dielectric layer 324, and the third dielectric layer 326, according to an embodiment. In an embodiment, the fourth dielectric layer 328 may be patterned to form a terminating edge 329 within the isolated region 352 between the through-wafer via 340 and the active region 350. In an embodiment, the fourth dielectric layer 328 may include an etch stop layer. In an embodiment, the fourth dielectric layer 328 may include one or more of AlN, $Al_2O_3$, $Si_XN_Y$, SiON, $SiO_2$, tetraethyl TEOS, and ITO. In an embodiment, the fourth dielectric layer 328 may have a thickness of between about 100 angstroms and 50000 angstroms. In other embodiments, the fourth dielectric layer may have a thickness between about 1000 angstroms and 10000 angstroms though other thickness values may be used. Without departing from the scope the inventive subject matter, the protection region may be formed as a dielectric layer formed and patterned underneath the first dielectric layer 322, the second dielectric layer 324, and the third dielectric layer 326 (embodiment not shown).

Figure 4:
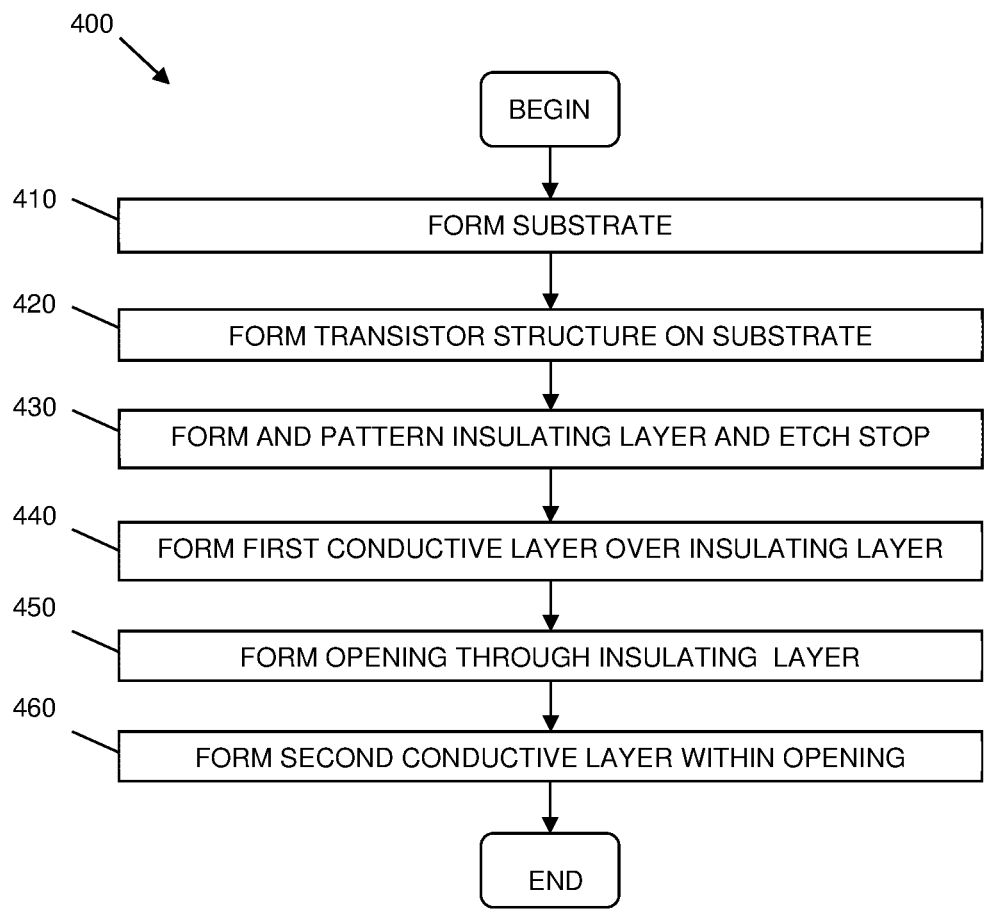
FIG. 4 is a process flow diagram describing a method for fabricating the devices of FIGS. 2 and 3 in accordance with an embodiment.

FIG. 4 is a simplified flowchart 400 depicting a method of fabricating a device (e.g., device 200 of FIG. 2), according to an embodiment. In block 410, a substrate (e.g., substrate 210) is formed as is described in connection with FIG. 5 and step 500. In block 420, a transistor structure 251 (e.g., active region 250) and transistor elements (e.g. source electrode 260, drain electrode 264, and gate electrode 270) are formed as is described in FIGS. 6-9 and steps 600-900. In block 430, one or more etch stops are formed (e.g., first dielectric layer 222 or second dielectric layer 224) either as part of the processing of the transistor structure 251 or as a separate dielectric layer formed before or after the transistor fabrication sequence (e.g. the fourth dielectric layer 328) as is described in FIGS. 4-12 and steps 400-1250. In block 440, the via pads 230, 330 (first conductive region) is formed as will be described in FIGS. 10A and 10B. In block 450, one or more openings (e.g., through-wafer vias 240 and 340) are formed as described in FIGS. 11, 12, 13A, 13B, 14A, and 14B and steps 1100, 1200, 1300, 1301, 1400, and 1401. In block 460, the second conductive region (e.g. back metal layer 244) is formed as described in FIGS. 16A and 16B steps 1500 and 1550.

FIGS. 5, 6, 7, 8, 9, 10A, 10B, 11, 12, 13A, 13B, 14A, 14B, 15A, 15B, and 16B display simplified cross sectional views of a series of fabrication steps for forming the device 200 of FIG. 2 and device 300 of FIG. 3 according to an embodiment. Referring simultaneously to FIG. 4, block 410 and FIG. 5, a step 500 of the method includes forming the substrate 210 and then depositing the first dielectric layer 222 over the upper substrate surface 212, according to an embodiment. In an embodiment, forming the substrate 210 may include providing the host substrate 201 and depositing the buffer layer 214, the channel layer 216, the barrier layer 218, and a cap layer (not shown) over and on top of the host substrate 201. The host substrate 201 may include Si, sapphire, SiC, GaN, AlN, diamond, poly-SiC, Si on insulator, GaAs, InP, or other suitable materials. According to an embodiment, the buffer layer 214 may be deposited on or over an upper surface 213 of the host substrate 201. The buffer layer 214 may include one of GaN, AlGaN, InGaN, a combination of these, or other suitable materials. According to an embodiment, the channel layer 216 may be deposited on or over an upper surface of the buffer layer 214. The channel layer 216 may include one of GaN, AlGaN, InGaN, a combination of these, or other suitable materials. According to an embodiment, the barrier layer 218 may be deposited on or over channel layer 216. The barrier layer 218 may include one of AlGaN, InAlN, a combination of these or other suitable materials. According to an embodiment, a cap layer (not shown) may be deposited on or over the barrier layer 218. The cap layer may include GaN or other suitable materials. Each of the buffer layer 214, the channel layer 216, the barrier layer 218, and the cap layer may be grown over an upper surface 213 of the host substrate 201 using one of metal-organo chemical vapor deposition (MOCVD), molecular beam epitaxy (MBE), hydride-vapor phase epitaxy (HVPE) or a combination of these techniques, though other suitable techniques may be used.

Figure 5:
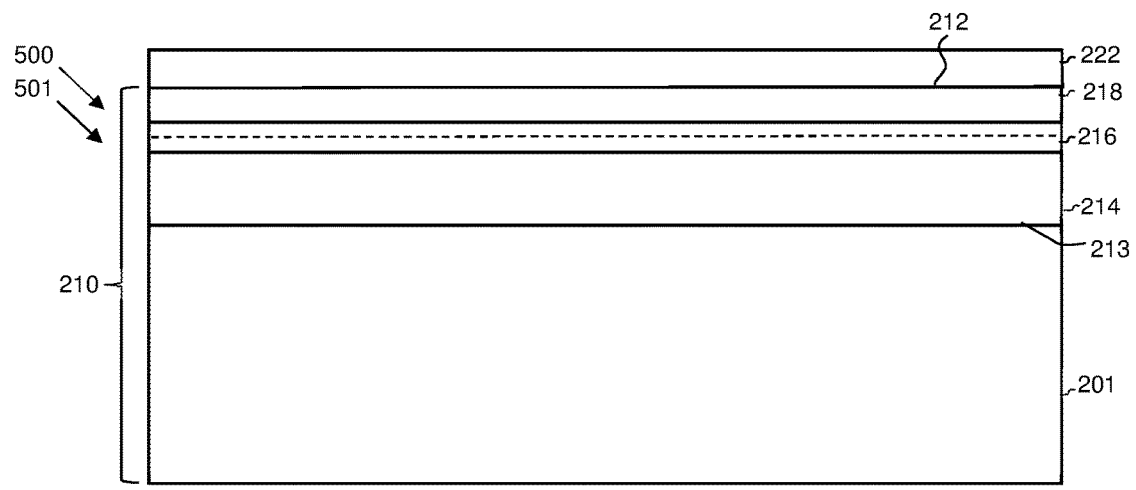
FIGS. 5, 6, 7, 8, 9, 10, 11A, 11B, 12A, 12B, 13, 14, 15A, 15B, 16A, 16B, 17A, 17B, 18A, and 18B are cross sectional views describing a method for fabricating the devices of FIGS. 2 and 3 in accordance with an embodiment.

According to an embodiment, and still referring to FIG. 4, block 410 and FIG. 5, in a step 500, the method may further include depositing the first dielectric layer 222 of the insulating layer 220 of FIG. 2 over the upper substrate surface 212. In an embodiment, the first dielectric layer 222 may include one or more layers of silicon nitride, $SiO_2$, $HfO_2$, $Al_2O_3$, diamond, poly-diamond, AlN, BN, SiC a combination of these or other insulating materials. The total thickness of the layer(s) used to form the first dielectric layer 222 may be between about 100 angstroms and about 10,000 angstroms in thickness, although other thickness values may be used. In an embodiment, the first dielectric layer 222 may be formed by depositing $Al_2O_3$ over and in contact with the substrate 210 and then depositing $Si_XN_Y$ over the $Al_2O_3$ layer. In another embodiment, the first dielectric layer 222 may be formed by depositing $Al_2O_3$ or $Si_xN_y$ or a combination of these over and in contact with the substrate 210 and then depositing diamond, AlN, or another suitable substantially insulating material over the $Al_2O_3$ layer. The first dielectric layer 222 may be deposited using low pressure chemical vapor deposition (LPCVD), plasma-enhanced chemical vapor deposition (PECVD), sputtering, physical vapor deposition (PVD), atomic layer deposition (ALD), catalytic chemical vapor deposition (Cat-CVD), hot-wire chemical vapor deposition (HWCVD), electron-cyclotron resonance (ECR) CVD, inductively coupled plasma (ICP) CVD, a combination of these or other suitable dielectric deposition technique(s). Structure 501 results.

Referring now simultaneously to FIG. 4, block 420 and FIGS. 6-11, steps 600-1100, the method of fabricating device 200 of FIG. 2 may further include forming the transistor structure 251 depicted in FIG. 2. Forming the transistor structure 251 of FIG. 2 may include forming an active region 250 defined by an isolation region 252, according to an embodiment. In an embodiment, defining the active region 250 may be followed by forming ohmic contacts 262 to the substrate 210. The ohmic contacts 262 may be used to form the source electrode 260 and the drain electrode 264, according to an embodiment. In an embodiment, forming the ohmic contacts 262 may be followed by forming a gate electrode 270 coupled to the substrate 210, forming the second dielectric layer 224 over the gate electrode, forming interconnect metal layers 266 and 268, over the second dielectric layer and ohmic contacts 262, and forming the third dielectric layer 226 over the second dielectric layer 224 and the interconnect metal layers 266 and 268. It should be appreciated that the number and order of processing steps in embodiments of the method is exemplary and that other embodiments of the method may have more or fewer processing steps performed in the same other orders without limitation. It should also be appreciated that forming the various elements of the transistor structure 251 may also combine with forming portions or all of the insulating layer 220 and associated etch stop layer(s) of FIG. 2 as denoted in the step of the method of FIG. 4, block 430. It should be appreciated that the method of fabricating the transistor structure 351 of device 300 of FIG. 3 is analogous to forming the transistor structure 251 of FIG. 2 where like elements of FIG. 3 (e.g. active region 350, ohmic contacts 362, source electrode and drain electrode 360 and 364, the gate electrode 370, and first, second, and third dielectric layers 322, 324, and 326) may be formed analogously to the corresponding numbered elements of FIG. 2 (e.g. active region 250, ohmic contacts 262, source electrode 260, and drain electrode 264, gate electrode 270, first, second, and third dielectric layers 222, 224, and 226). For the sake of brevity, descriptions of forming these numbered elements of FIG. 3 will not be repeated.

Figure 6:
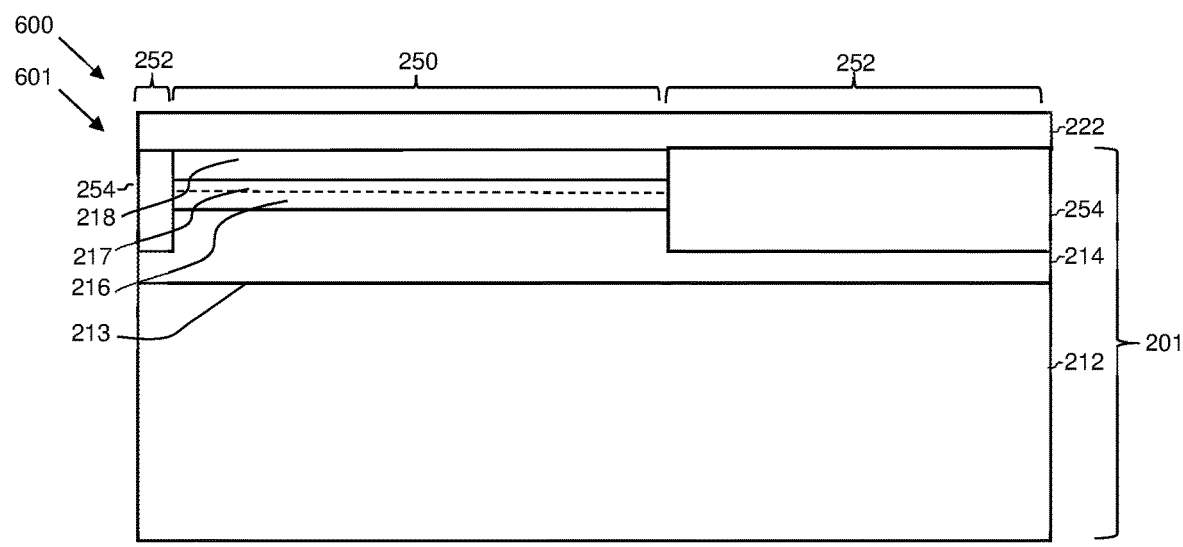

Referring now simultaneously to FIG. 4, block 420 and FIG. 6, step 600, the method of forming the transistor structure 251 and device structure 200 of FIG. 2 may include forming the isolation region 252. Forming the isolation 252 may include forming a masking layer (not shown) over the structure 501 of FIG. 5 and then implanting an ion species through the first sub-layer layer 224 and into the substrate 210 to create the isolation region 252 that defines the active region 250. Implanting the ion species may include exposing unmasked portions of the substrate 210 to an appropriate dose of ion beam irradiation. According to an embodiment, the isolation region 252 may be formed by implanting an ion species at an energy sufficient to drive the ion species through the first dielectric layer 222 and into the barrier layer 218, channel layer 216, and buffer layer 214, thus damaging the crystal lattice for these layers, disrupting the channel 217 within the isolation region 252, and creating high resistivity regions 254 within the substrate 210. According to an embodiment, one of N, boron (B), helium (He), hydrogen (H), oxygen (O), or a combination of these or one or a combination of other suitable ion species may be implanted in the isolation region 252 to create high resistivity regions 254 below the upper surface 212 of the substrate 210. The depth of high resistivity regions 254 depends on the thicknesses of the first dielectric layer 222, barrier layer 218, channel layer 216, and buffer layer 214 as well as the accelerating potential and mass of the ion species implanted into the substrate 210. Both the presence of the implanted species as well as the damage caused within the crystal lattice within the substrate 210 render the affected high resistivity regions 254 semi-insulating, thus forming the isolation region 252. After formation of isolation region 252, the masking layer is removed using appropriate etchants or solvents (not shown).

In other embodiments (not shown), the isolation region 252 may be formed by removing (e.g., etching) the first dielectric layer 222, the barrier layer 218, the channel layer 216, and the buffer layer 214 within the isolation region 252 to remove the channel 217 within the isolation region 252. In these embodiments using etched isolation, the etching of semiconductor layers that overlie the host substrate 201 including barrier layer 218, channel layer 216, and buffer layer 214 may terminate within one of these layers. Alternatively, the etching may terminate on the upper surface 213 of the host substrate 201 or may extend into the host substrate 201, below the upper surface 213. In some embodiments, etching may be used in conjunction with ion implantation to create the active region 250 from the isolation region 252. Structure 601 results.

Referring now to FIG. 4, block 420, and FIG. 7, step 700, the method of fabricating the transistor structure 251 of device 200 may further include forming ohmic contacts 262 of FIG. 2 used to form the source electrode 260 and the drain electrode 264 of FIG. 2 within the active region 250. Patterning the first dielectric layer 222 to create ohmic openings 710 may include applying a resist layer (e.g. photo resist, not shown), exposing unmasked portions of the resist layer with an appropriate dose or doses of photon and/or electron beam irradiation and then developing the resist layer with an appropriate developer. In an embodiment, the ohmic openings 710 may be aligned to the isolation region 252 using alignment marks or other appropriate means created using a separate alignment mark level (not shown) also aligned to the isolation region 252. In other embodiments, step 700 may be a first step in the method, requiring no alignment to a prior process layer.

In an embodiment, an etch process may be used to remove portions of the first dielectric layer 222 (within openings 710). In an embodiment, the first dielectric layer 222 may be removed using an appropriate dry or wet etch technique or a combination of both. In an embodiment, dry etching of the first dielectric layer 222 to expose a portion of the upper substrate surface 212 may include reactive ion etching (RIE), inductively coupled plasma (ICP) etching, ECR etching or a combination of these techniques, though other suitable techniques may be used. Suitable fluorine (F)-based dry etch chemistries such as sulphur hexafluoride ($SF_6$), carbon hexafluoride ($C_2F_6$), carbon tetrafluoride ($CF_4$), or other suitable dry etch chemistries may be used. The dry etch chemistries may be supplemented with argon (Ar) or oxygen ($O_2$) or a combination of these or other suitable gases to prevent polymer formation within the openings 1220 when etching the first dielectric layer 222. Wet etching of the first dielectric layer 222 may be accomplished using hydrofluoric acid (HF), dilute HF, buffered oxide etch (BOE), hot phosphoric acid ($H_3PO_4$), or other suitable wet chemistry techniques. In an embodiment, when the first dielectric layer 222 includes a SiN layer deposited over a wet-etchable layer (e.g. $Al_2O_3$) the first dielectric layer 222 may be etched using an F-based dry etch such as RIE, ICP, or ECR to remove the SiN layer followed by a BOE wet etch to remove the $Al_2O_3$ layer, exposing portions of the upper substrate surface 212 underlying openings 710.

In an embodiment, an ohmic metal layer (not shown) may be deposited over and into the openings 710 in contact with the exposed portions of the upper substrate surface 212 of the substrate 210. In an embodiment, the ohmic contacts 262 include a multi-layer stack of metals, including metal layers, from bottom to top, of Ti, Al, molybdenum (Mo), and Au, although other suitable materials may be used. In an embodiment, the thickness of the Ti layer may range from about 50 to about 500 angstroms, the thicknesses of the Al layer may range from about 500 to about 5000 angstroms, the thicknesses of the Mo layer may range from about 500 to about 1000 angstroms, and the thickness of the Au layer may range from about 500 to about 1000 angstroms, although other ranges of thicknesses may be used for each layer. In some embodiments, one or more of the Ti, Al, Mo, or Au layers may be omitted or substituted for other suitable materials. In an embodiment, the multi-layer stack of metals may be deposited by evaporation, sputtering, PVD, ALD, or other suitable deposition techniques. In an embodiment, the excess regions of ohmic metal layer not within the openings 710 may be removed using a "lift-off" technique by immersing the wafer in solvents that penetrate the resist layer (not shown). This may cause the ohmic metal layer that was in contact with the upper surface of the resist layer, but not directly in contact with substrate 210 to wash away (not shown). In other embodiments, other techniques known in the art such as etching may be used to pattern the ohmic contacts 262.

The method may further include annealing the ohmic contacts 262 to provide a low resistance connection from the ohmic contacts 262 to the channel 217, according to an embodiment. In an embodiment, an RTA system may be used to anneal the ohmic contacts 262 at a temperature between about 500 and about 900 degrees Celsius (° C.) for 15 to 120 seconds, though other suitable temperatures and times may be used. In an embodiment, the RTA system may use one of nitrogen ($N_2$), oxygen ($O_2$), or forming gas ambient, though a combination of these or other suitable ambient gasses may be used. In an embodiment, the time, temperature, and ambient gasses are optimized to create an ohmic contact between the ohmic contacts 262 and the channel 217. The ohmic contact resistance between the ohmic contacts 262 and the channel 217 may between about 0.05 and about 1.00 ohm-mm though other contact resistance values may be used. Structure 701 results.

Referring now to block 420 of FIG. 4 and FIG. 8, step 800, the method of fabricating the transistor structure 251 of device 200 may further include forming the gate electrode 270 according to an embodiment. In an embodiment, forming the gate electrode 270 may include applying and patterning resist layer(s) to create a gate contact opening 810 in the first dielectric layer 222 and etching the first dielectric layer 222 analogous to steps described in FIG. 7 and step 700. The embodiment may further include depositing gate metal and patterning the gate metal, analogous to the steps described for forming the ohmic contacts 262 in FIG. 7 and step 700.

In an embodiment, photo resist or e-beam resist (not shown) may be patterned to create an opening in the resist in a manner analogous to the description given for FIG. 7 and step 700. Using the opening created in the resist layer, the first dielectric layer 222 may be etched to form a gate contact opening 810, thus exposing a portion of the upper substrate surface 212, according to an embodiment. In an embodiment, one or more layers of gate metal may then be deposited over the opening in the resist to form the gate electrode 270 over the upper substrate surface 212 of the substrate 210. Depositing gate metal to form the gate electrode 270 may include depositing a multi-layer stack that includes one or more metal layers and/or other suitable materials. A first layer within the multi-stack used to form the gate electrode 270 may include Ti, Ni, Pt, Cu, palladium (Pd), Cr, W, Iridium (Jr), poly-silicon or other suitable materials. The first layer may be between about 30 and about 2,000 angstroms in thickness, although other thickness values may be used. One or more layers that act as conductive layers may be deposited over the first layer to form the gate electrode 270, according to an embodiment. The conductive layer(s) may include Au, Ag, Al, Cu, Ti or other substantially conductive materials. The conductive layer(s) may be between about 50 and about 20,000 angstroms in thickness, although other thickness values may be used. Optionally, one or more barrier metal layers may be placed between the first layer and the conductive layer(s), where the barrier metal layer(s) may include materials such as Ni, Pt, Cu, Pd, Cr, W, Jr or other substantially refractive materials that act as a barrier between the portion of the first layer that contacts the substrate 210 and the conductive layer(s). The barrier metal layer(s) may be between about 50 and about 10,000 angstroms in thickness, although other thickness values may be used. In an embodiment, the various layers used to form gate electrode 270 may be deposited by evaporation, sputtering, PVD, ALD, or other suitable deposition technique(s).

It should be appreciated that other methods may be used to form the gate electrode 270 without departing from the scope of the inventive subject matter. In methods for fabricating these other embodiments (not shown), the gate electrode 270 may be formed by patterning a first resist layer to form an opening, etching the first dielectric layer 222 to create an opening exposing the upper substrate surface 212 of the substrate 210, and then removing the first resist layer. In this embodiment, forming the gate electrode 270 includes patterning an opening in a second resist layer aligned over the opening created in the first dielectric layer 222 to expose the upper substrate surface 212. The opening in the second resist layer may be smaller or larger than the opening in the first dielectric layer 222. In other embodiments, gate metal may be disposed over a gate dielectric such as $SiO_2$, $HfO_2$, $Al_2O_3$, or similar materials (not shown). The gate dielectric may be deposited over and above the upper substrate surface 212, according to an embodiment. In still other embodiments, the gate electrode 270 may be formed using gate metal that is deposited over the substrate 210 and is then defined by patterning photo resist, and then etching the gate metal. In whichever embodiment or method is selected to form gate electrode 270, gate metal may then be deposited using the methods described in connection with the formation of gate electrode 270 shown in FIG. 8.

Figure 9:
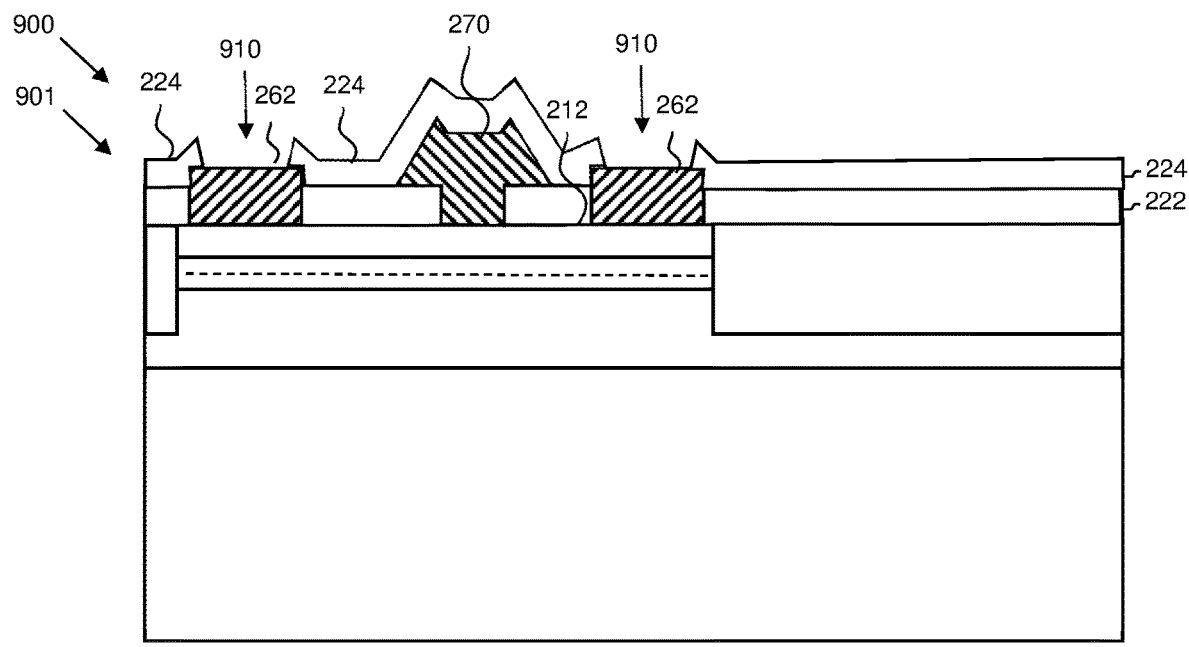

Referring now to blocks 420 and 430 of FIG. 4, FIG. 9 and step 900, the method of fabricating the transistor structure 251 and insulating layer 220 of device 200 of FIG. 2 may further include depositing and patterning the second dielectric layer 224 over the ohmic contacts 262, the gate electrode 270, and first dielectric layer 222 of structure 801 of FIG. 8 according to an embodiment. In an embodiment, the second dielectric layer 224 may include one of SiN, $Al_2O_3$, $SiO_2$, $HfO_2$, ITO, diamond, poly-diamond, AlN, BN, SiC, or a combination of these or other insulating materials. The total thickness of the layers used to form the second dielectric layer 224 may be between about 100 and about 10,000 angstroms in thickness, although other thickness values may be used. The second dielectric layer 224 may be deposited using LPCVD, PECVD, sputtering, PVD, ALD, Cat-CVD, HWCVD, ECR CVD, CVD, ICP-CVD, a combination of these or other suitable dielectric deposition technique(s).

In an embodiment, additional process steps to etch the second dielectric layer 224 are analogous to those used to etch the first dielectric layer 222 as described in connection with FIG. 7, step 700, and may be used to create openings 910. In an embodiment, the second dielectric layer 224 may be patterned by placing a resist layer (not shown) over second dielectric layer 224, and patterning the resist layer to form openings to portions of the second dielectric layer 224 over ohmic contacts 262. The second dielectric layer 224 may then be etched through the openings using a technique analogous to the etching of first dielectric layer 222, as described in connection with FIG. 7, step 700. Structure 901 results.

Figure 10:
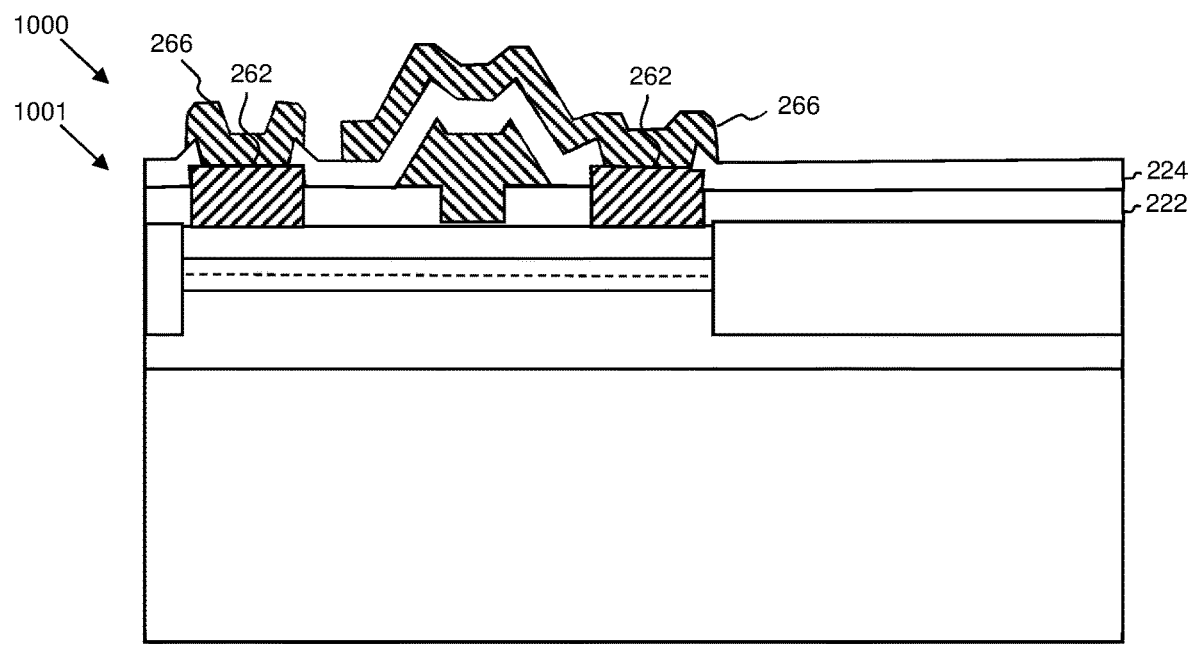

Referring now to block 430 of FIG. 4, FIG. 10 and step 1000, the method of fabricating the transistor structure 251 of device 200 of FIG. 2 may further include depositing and patterning the first interconnect metal 266 over the ohmic contacts 262 and the second dielectric layer 224 of structure 901 of FIG. 9, according to an embodiment. In an embodiment, forming and patterning the first interconnect metal 266 may be accomplished by applying and patterning resist layers (not shown), depositing first interconnect metal 266, and removing the resist layers and overlying first interconnect metal 266 in a lift-off configuration, analogous to step 700 in FIG. 7. In an embodiment, the first interconnect metal 266 is formed by depositing one or more adhesion and conductive metal layers into openings (not shown) patterned into resist layers applied to the partially-formed device as described above. In an embodiment, the adhesion layer(s) may be deposited first, followed by deposition of the conductive layer(s). In an embodiment, the adhesion and conductive layers may be deposited in the same deposition step. The adhesion layer(s) may include one of Ti, Ni, Cr or other suitable adhesion layer material(s). The adhesion layer(s) may be between about 50 and about 2,000 angstroms in thickness, although other thickness values may be used. The conductive layer(s) may include Cu, Au, Al, or Ag, although other suitable materials may be used. The conductive layer(s) may be between about 200 and about 40,000 angstroms in thickness, although other thickness values may be used. The adhesion and conductive layers used to form the first interconnect metal 266 may be deposited over and in contact with ohmic contacts 262 or the gate electrode 270, according to an embodiment. In an embodiment, the adhesion layer(s) and conductive layer(s) may be formed by sputtering, evaporation, or electro-plating. In an embodiment, after applying and patterning resist layers and depositing the first interconnect metal 266, the resist layers and metals deposited over the resist layers and not included with the portions of the first interconnect metal 266 that contact the ohmic contacts 262 and the second dielectric layer 224 are removed using solvents analogous to those described in conjunction step 700 in FIG. 7. In other embodiments, the first interconnect metal 266 may be formed by depositing adhesion and conductive layers that are then patterned by suitable dry or wet chemical etching techniques. Structure 1001 results.

Figure 11A:
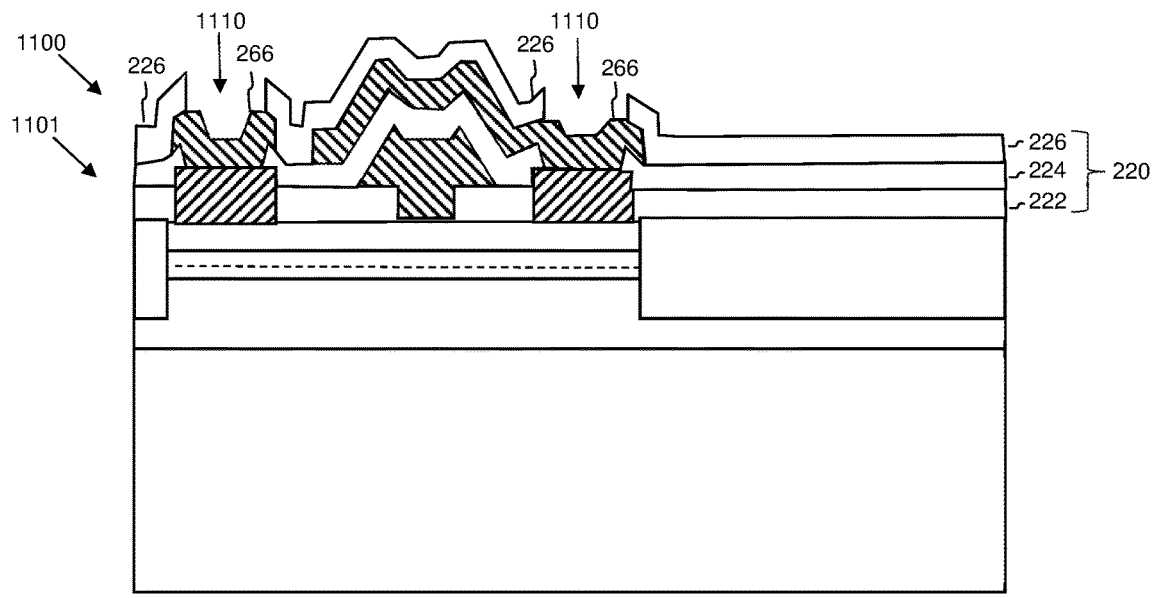

Referring now to blocks 420 and 430 of FIG. 4 and FIG. 11A, step 1100, the method of fabricating the transistor structure 251 and the insulating layer 220 of device 200 of FIG. 2 may further include depositing and patterning the third dielectric layer 226 over the substrate 210, the first dielectric layer 222, the ohmic contacts 262, the gate electrode 270, the second dielectric layer 224, and the first interconnect metal 266 of structure 1001 of FIG. 10, according to an embodiment. In an embodiment, the third dielectric layer 226 may include one of SiN, $Al_2O_3$, $SiO_2$, $HfO_2$, ITO, diamond, poly-diamond, AlN, BN, SiC, or a combination of these or other insulating materials. The total thickness of the layers used to the form the third dielectric layer 226 may be between about 100 and about 10,000 angstroms in thickness, although other thickness values may be used. The third dielectric layer 226 may be deposited using techniques analogous to those used for depositing the second dielectric layer 224 described in FIG. 9.

In an embodiment, additional process steps to etch the third dielectric layer 226 are analogous to those used to etch the first dielectric layer 222 as described in connection with FIG. 7, step 700, may be used to create openings 1110. In an embodiment, the third dielectric layer 226 may be patterned by placing a resist layer (not shown) over the second dielectric layer 224, and patterning the resist layer to form openings to portions of the second dielectric layer 224 over the first interconnect metal 266. The third dielectric layer 226 may then be etched through the openings in the resist layer to form openings 1110 using a technique analogous to the etching of the first dielectric layer 222 as described in connection with FIG. 7, step 700. The etching of the third dielectric layer 226 may stop on the first interconnect metal according to an embodiment. Structure 1101 results.

Figure 11B:
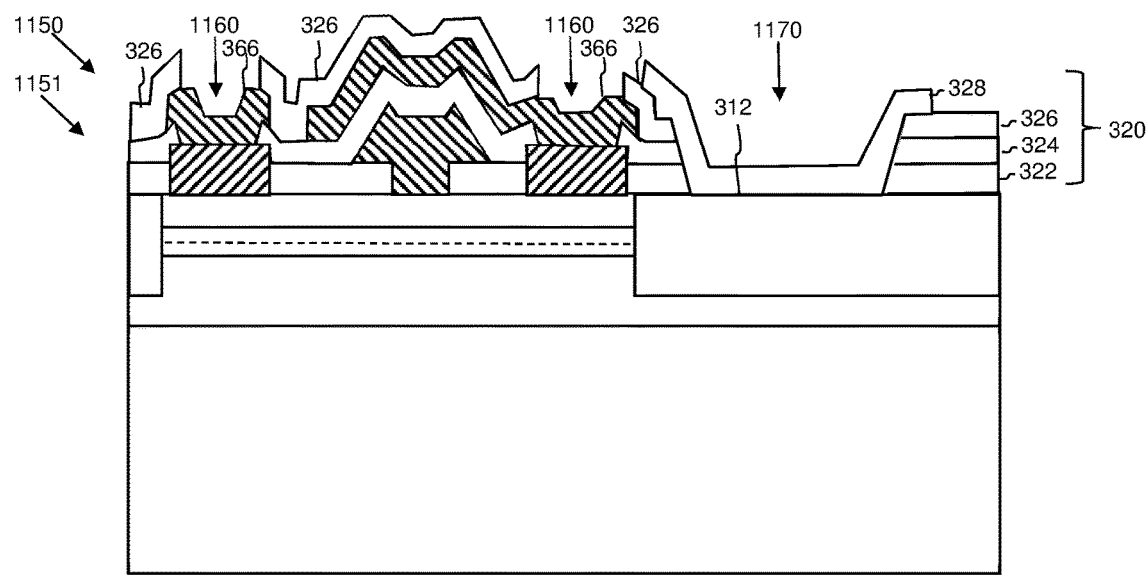

Still referring now to blocks 420 and 430 of FIG. 4 and now FIG. 11B, in another embodiment of the method used to form the device 300 of FIG. 3, the third dielectric layer 326 may be formed analogously to the third dielectric layer 226 of FIG. 2, as shown and described in connection with FIG. 11A, step 1100 of the method, and a fourth dielectric layer 328 may be formed and patterned over the third dielectric layer 326. In an embodiment, forming openings in the third dielectric layer 326 may include etching the third dielectric layer 326 to form openings 1160 and stopping on the first interconnect metal 366. In an embodiment, a multi-layer opening 1170 may be formed by etching the third dielectric layer 326, the second dielectric layer 324, and the first dielectric layer 322, stopping the etch on the upper surface 312 of the substrate 310. Etching the openings 1160 and multi-layer opening 1170 may be accomplished using the same masking level, according to an embodiment. In other embodiments, separate masking levels may be used to etch the openings 1160 and the multi-layer opening 1170. After creating the multi-layer opening 1170, the fourth dielectric layer 328 may be formed over the third dielectric layer 326 and within the multi-layer opening 1170, according to an embodiment. In an embodiment, the fourth dielectric layer may be formed before the openings 1160 are formed in the third dielectric layer 326. In an embodiment, the fourth dielectric layer 328 may include one of SiN, $Al_2O_3$, $SiO_2$, $HfO_2$, ITO, diamond, poly-diamond, AlN, BN, SiC, or a combination of these or other insulating materials. The total thickness of the layers used to the form the fourth dielectric layer 328 may be between about 100 and about 100,000 angstroms in thickness, although other thickness values may be used. The fourth dielectric layer 328 may be deposited using techniques analogous to those used for depositing the second dielectric layer 224 described in FIG. 9, according to an embodiment. In an embodiment, the fourth dielectric layer 328 may be patterned by selectively etching the fourth dielectric layer (e.g., ITO, AlN, or $Al_2O_3$), stopping on the third dielectric layer 326 (e.g. SiN, $SiO_2$, AlN, or $Al_2O_3$). In an embodiment where the fourth dielectric layer includes an ITO etch stop layer and the third dielectric layer includes at least one of SiN, $SiO_2$, or SiON, the ITO layer may be etched using Cl-based dry chemistry (e.g. $BCl_2$ or $Cl_2$) or a suitable wet etch chemistry (e.g., hydrochloric acid (HCl)), stopping on the SiN, SiON, or $SiO_2$ layer. Likewise, in an embodiment where the fourth dielectric layer includes AlN or $Al_2O_3$ and the third dielectric layer includes at least one of SiN, $SiO_2$, or SiON, the AlN or $Al_2O_3$ layer may be etched using Cl-based dry chemistry (e.g. $BCl_2$ or $Cl_2$) or a suitable wet etch chemistry such as ammonium hydroxide ($NH_4OH$), HF, BOE, or other suitable chemistry, stopping on the SiN. In an embodiment, the openings 1160 may be formed after the fourth dielectric layer 328 is formed and patterned. In other embodiments, the openings 1160 may be formed before the fourth dielectric layer 328 is formed and patterned. Structure 1151 results.

Figure 12A:
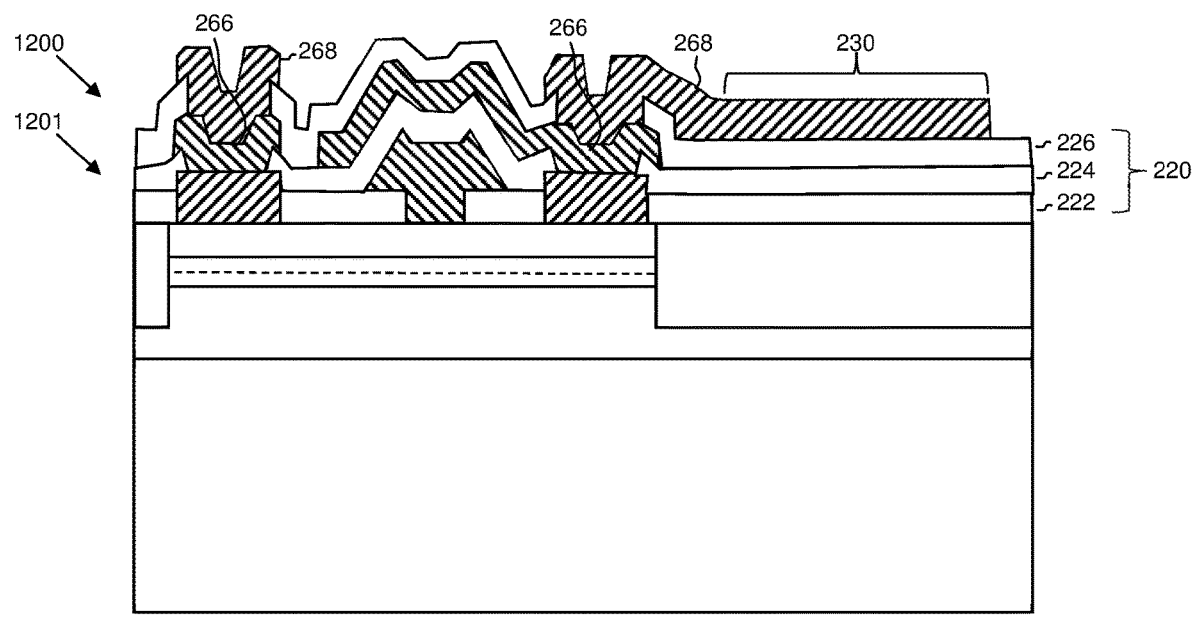
Figure 12B:
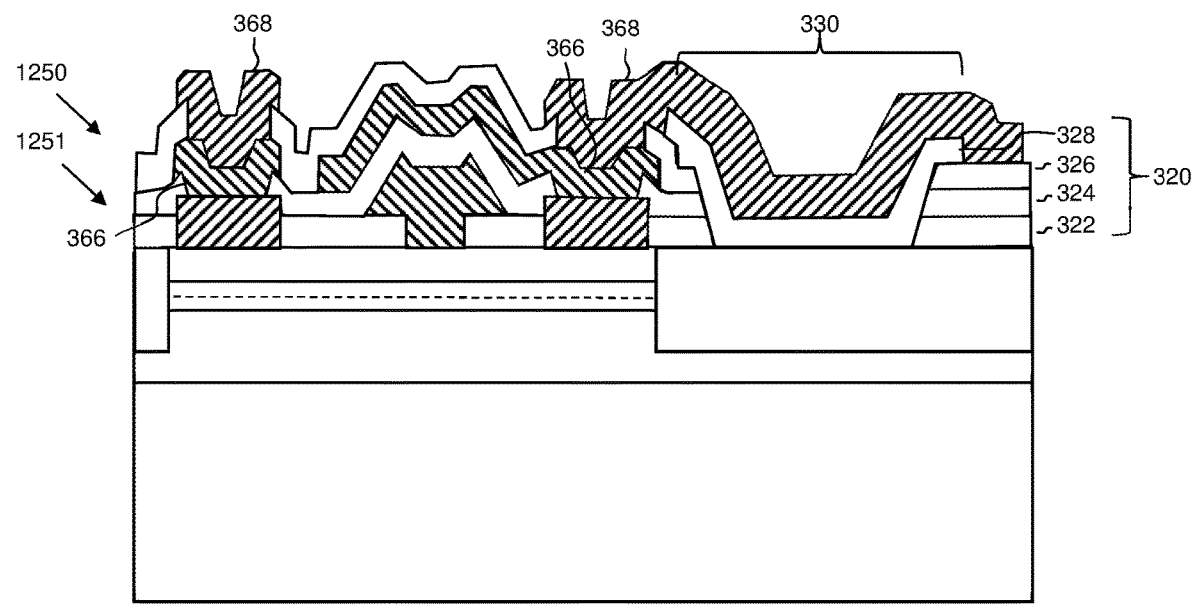

Referring now to FIG. 4, block 440 and FIGS. 12A and 12B, steps 1200 and 1250, and according to an embodiment, the method of fabricating devices 200 and 300 of FIGS. 2 and 3 may further include depositing and patterning the second interconnect metal 268 and 368 to form the via pad 230 and 330 (first conductive layer) over the insulating layers 220 and 320. In an embodiment of the method for forming the device 200 of FIG. 2, the via pad 230 may be formed over the insulating layer 220 formed by the stack that includes the third dielectric layer 226 formed over the second dielectric layer 224 and the first dielectric layer 222 of structure 1101 of FIG. 11A. In an embodiment of the method for forming the device 300 of FIG. 3, the via pad 330 may formed over the insulating layer 330 that includes the fourth dielectric layer 328 formed over the third dielectric layer 326 that is formed over the second dielectric layer 324 and first dielectric layer 322 of structures 1151 of FIG. 11B. Forming the second interconnect metal 268 and 368 may also include depositing the layer over and into the openings 1110 of FIG. 11A and 1160 of FIG. 11B. The second interconnect metal 268 and 368 that forms the via pads 230 and 330 may be formed over the insulating layers 220 and 320 by depositing an adhesion layer of Ti, Ni, or Cr and then a second conductive layer of Cu, Au, Al, although other suitable materials may be used. The adhesion layer may be between about 100 and about 2000 angstroms in thickness, although other thickness values may be used. The conducting layer may include Cu, Au, Al, or Ag, although other suitable materials may be used. The conducting layer may be between about 1000 and about 100,000 angstroms in thickness, although other thickness values may be used. In an embodiment, forming the second interconnect metal 268 and 368 may be accomplished by electro-plating, although other techniques such as evaporation and lift-off may be used. In other embodiments, the second interconnect metal 268 and 368 may be deposited using a blanket film using, e.g., sputtering that is then patterned by suitable dry or wet chemical etching techniques known in the art. Structures 1201 of FIG. 12A and 1251 of FIG. 12B result.

In some embodiments, additional process steps for depositing and patterning one or more additional dielectric layers for moisture and chemical protection may also be employed. The additional dielectric layer(s) may include one of silicon nitride ($Si_3N_4$), silicon dioxide ($SiO_2$), aluminum oxide ($Al_2O_3$), a combination of these or other suitable insulating dielectric layer(s). The additional dielectric layer(s) may have a total thickness of between about 100 and about 20,000 angstroms, although other thickness values may be used. The additional dielectric layer(s) may be formed using PECVD, ALD, ICP, ECR, Cat-CVD, HWCVD, sputtering, or other suitable deposition techniques.

FIG. 4, block 450 and FIGS. 13, 14, 15A, 15B, 16A, 16B and steps 1300, 1400, 1500, 1550, 1600, and 1650, depict further steps in the method of fabricating the devices 200 and 300 of FIGS. 2 and 3, respectively, according to an embodiments of the method. In an embodiment, the method may include forming through-wafer vias 240 and 340 within the substrates 210 and 310. For the sake of brevity, where there is commonality in fabrication steps, the steps will be shown for device 200 of FIG. 2 and steps particular to device 300 of FIG. 2 will be shown as needed.

Figure 13:
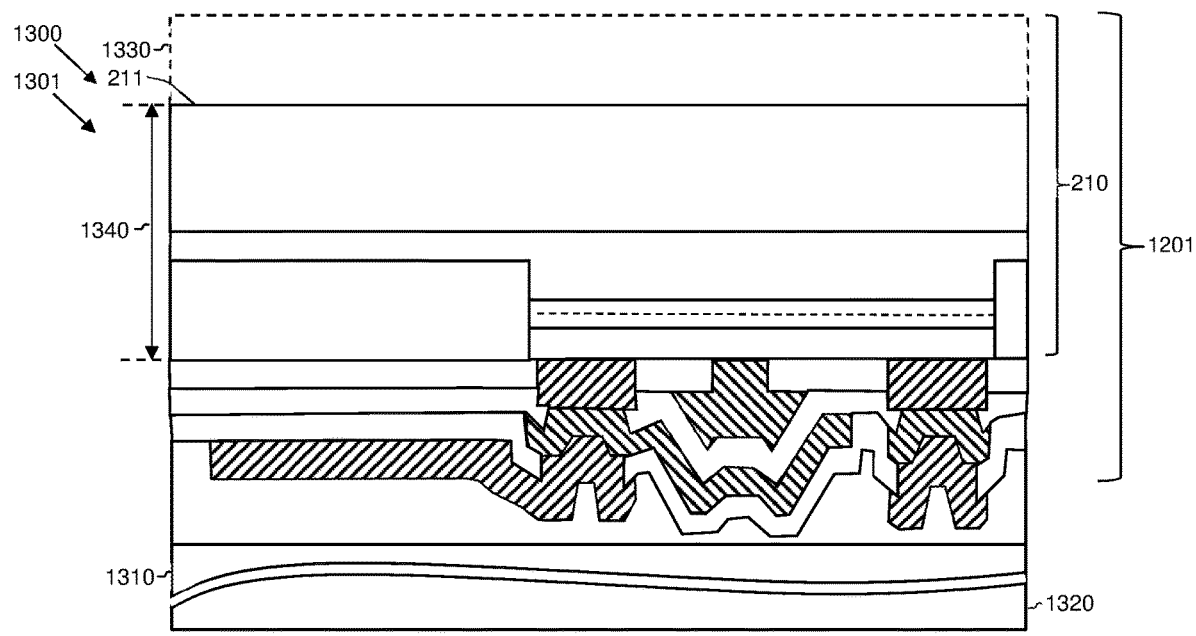

Referring simultaneously to FIG. 4, block 450 and FIG. 13, step 1300, further steps in the method of fabricating the devices 200 and 300 of FIGS. 2 and 3 may include flipping and mounting structure 1201 of FIG. 12A. Structure 1201 of FIG. 12 may be mounted by an adhesive layer 1310 to a carrier substrate 1320. In an embodiment, the substrate 210 is then thinned to a final substrate thickness 1340 by removing a portion 1330 of the substrate 210, exposing the lower substrate surface 211 using conventional grinding, lapping, and/or polishing techniques. In an embodiment, the final substrate thickness 1340 of the substrate 210 may be between about 50 and about 150 microns. In other embodiments, the final substrate thickness 1340 of the substrate 210 may be between about 10 and about 500 microns, though other thicknesses may be used. Structure 1301 results.

Figure 14:
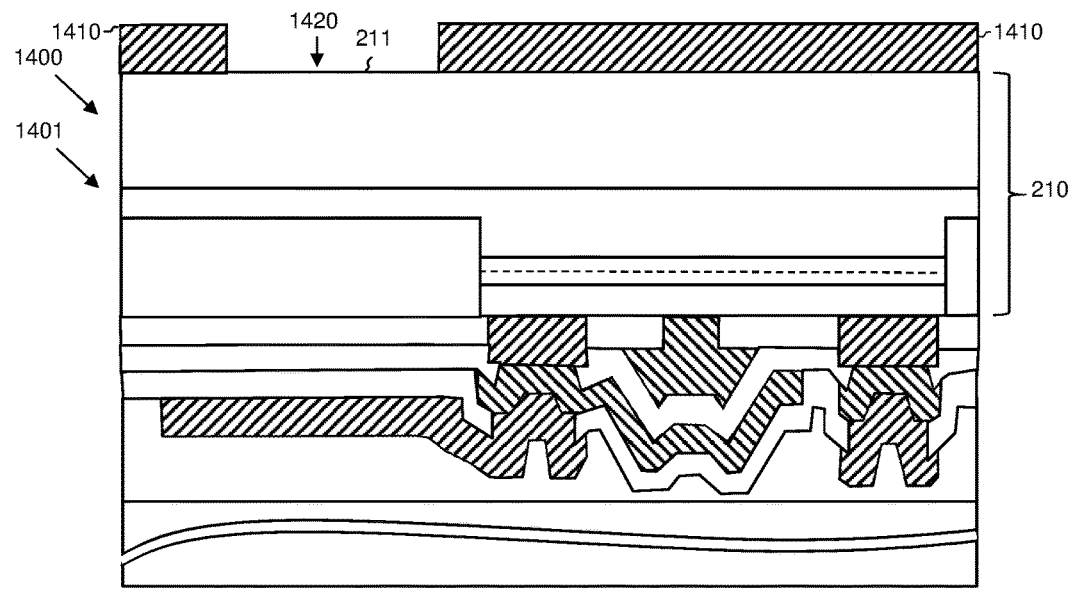

Referring now to FIG. 4, block 450 and FIG. 14 and step 1400, a hard mask 1410 may be formed by applying a suitable masking material to the lower substrate surface 211, according to an embodiment. The masking material 1410 may include Al, Ni, Cr, photo-resist, ITO or other suitable materials. In an embodiment, one or more openings 1420 may be created in the masking material. Structure 1401 results.

Figure 15A:
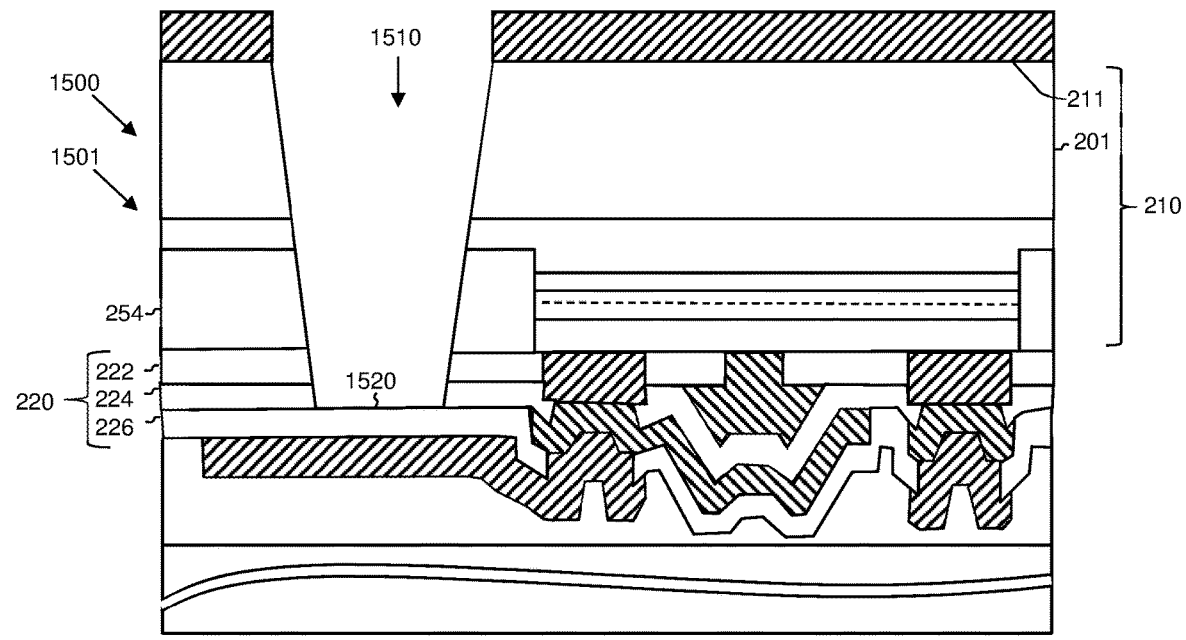
Figure 15B:
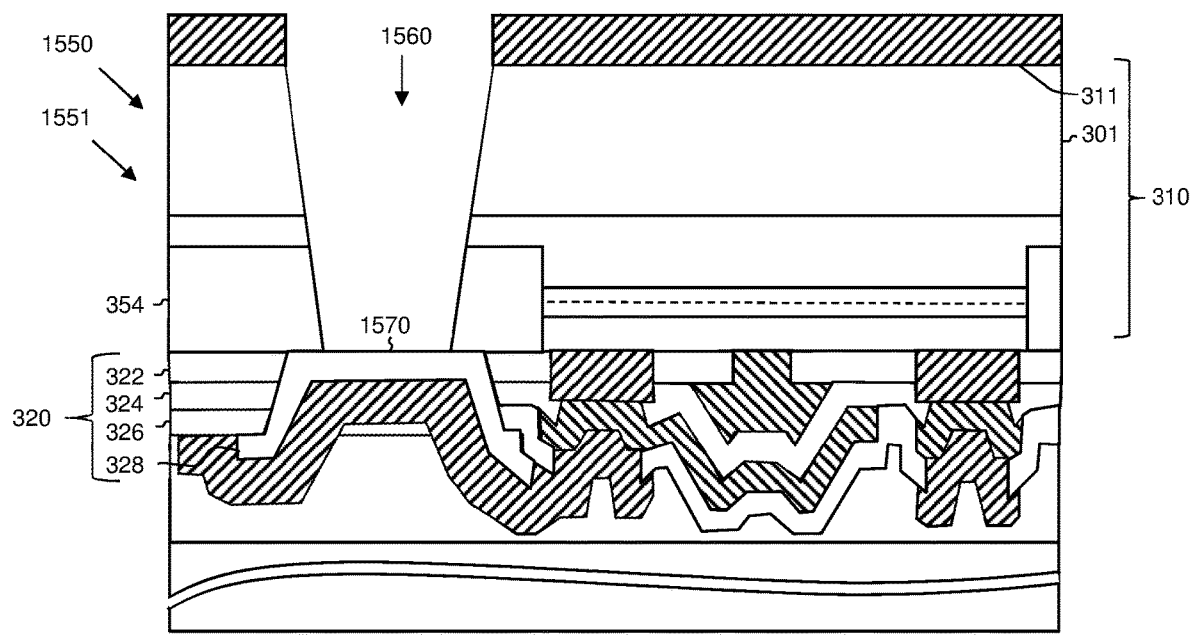

Referring now to FIG. 4, block 450 and FIGS. 15A, 15B and steps 1500 and 1550, respectively, the method includes forming partial substrate openings 1510 and 1560 that will be used to form through-wafer vias 240, 340 in the devices 200 and 300 of FIGS. 2 and 3, respectively. Partial substrate openings 1510 and 1560 may be formed by etching the substrate 210, 310 using a plasma etch technique. When the etching of the substrate 210, 310 is complete, the partial substrate openings 1510 and 1560 may extend from the lower surfaces 211, 311 and may terminate on a bottom surface 1520, 1570 of the etch stop layer within the insulating layer 220, 320. In the embodiment of device 200 of FIG. 2, when insulating layer 220 is the etch stop layer, the bottom surface 1520 of the insulating layer 220 may coincide with the surface of the third dielectric layer 226 that is exposed by the etch process. In other embodiments, the bottom surface 1520 of the insulating layer 220 may coincide with the surface of one of the second dielectric layer 224 or the first dielectric layer 222 if the etch stop material is included in one of these dielectric layers. In the embodiment of device 200 of FIG. 2, the bottom surface 1520 of the insulating layer 220 may include the exposed surface of the third dielectric layer 226. In other embodiments, the bottom surface 1520 of the insulating layer 220 may include exposed surfaces of one of the second dielectric layer 224 or the first dielectric layer 222 if the etch stop material is included in one of these dielectric layers (not shown). In the embodiment of device 300 of FIG. 3, the bottom surface 1570 of the insulating layer 320 may coincide with the surface of the fourth dielectric layer 328 that is exposed by the etch process. In other embodiments, the bottom surface 1570 of the insulating layer 320 may coincide with the surface of one of the third dielectric layer 326, the second dielectric layer 324 or the first dielectric layer 322 if the etch stop material is included in one of these dielectric layers (embodiments not shown). In an embodiment, plasma etching techniques may be used to create through-wafer via 240, 340 in the substrates 210, 310. These techniques may include RIE etching, ICP etching, ECR etching, or a combination of these techniques, though other suitable techniques may be used. The chemistries selected for the plasma etching techniques depend largely on the materials that comprise the host substrate 201 and the semiconductor layers that may overlie the host substrate 201. In an embodiment, the host substrate 201 includes SiC. In this embodiment, F-based etch chemistries such as $SF_6$, $C_2F_6$, $CF_4$, combinations of these, or other suitable chemistries may be used to etch the host substrate 201, 301. For embodiments that include GaN in the high resistivity regions 254, 354, Cl-based etch chemistries such as Cl, $BCl_3$, combinations of these, or other suitable chemistries may be used. For both F-based and Cl-based etching, $O_2$ or Ar, or other suitable gases may be added to prevent polymer formation during etching. Structures 1501 and 1551 result.

Figure 16A:
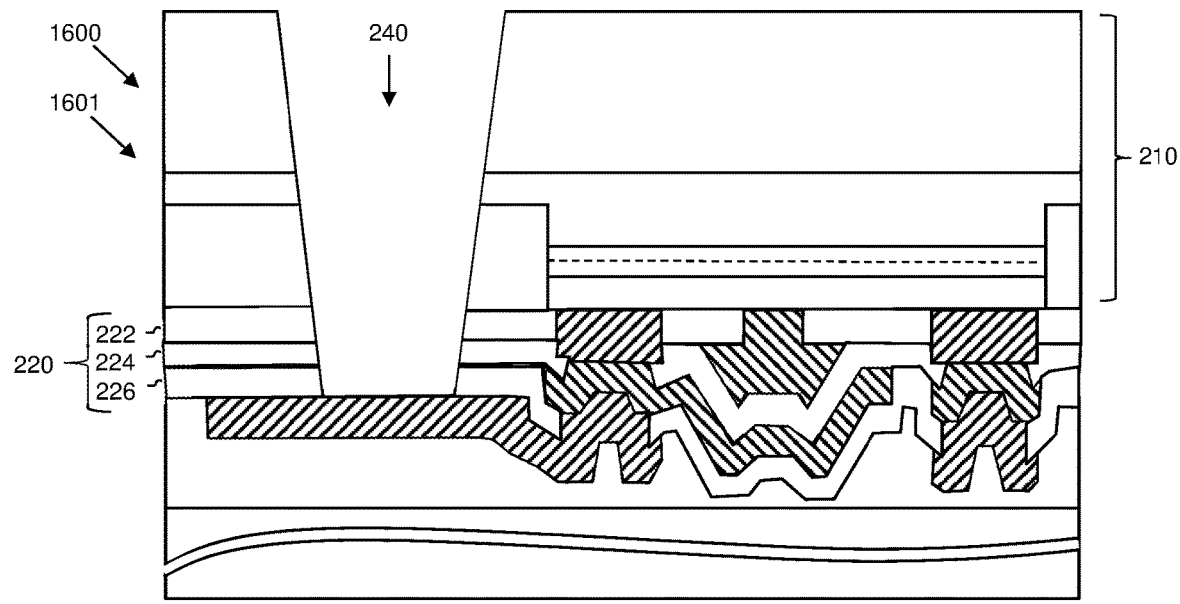
Figure 16B:
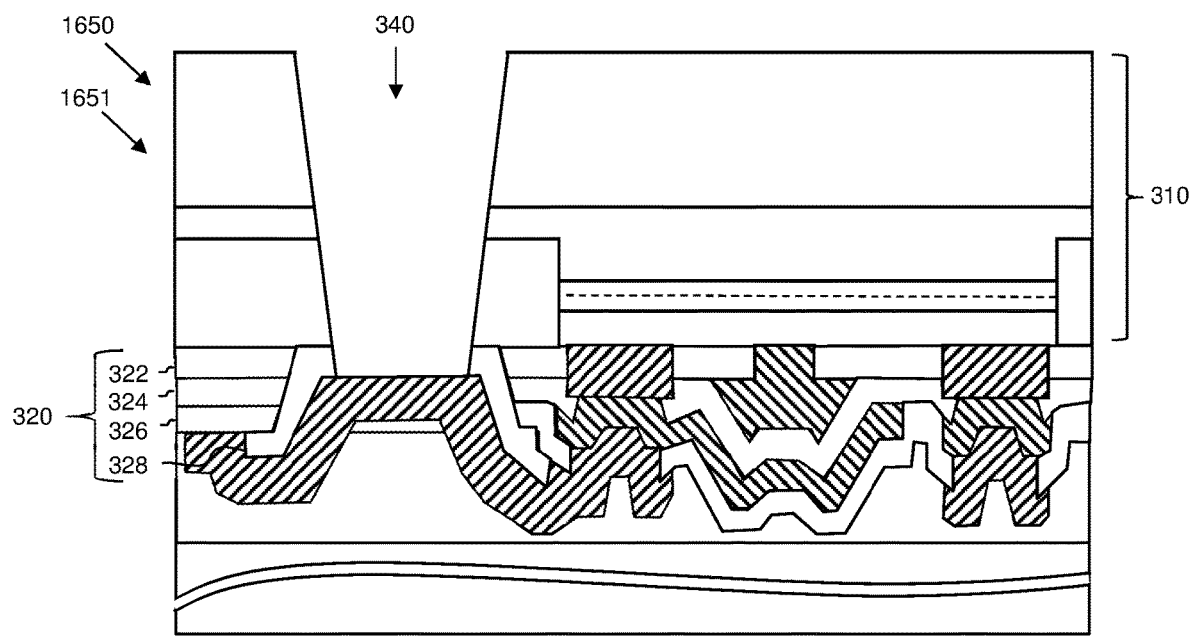

Referring now to FIG. 4, block 450 and FIGS. 16A, 16B and steps 1600 and 1650, respectively, the portion of the insulating layers 220 and 320 of FIGS. 2 and 3 that exposes the bottom portion 1520 and 1570 of FIGS. 15A and 15B may be removed to finish forming through-wafer vias 240 and 340, according to an embodiment. In an embodiment, the etch stop layer in the insulating layers 220 and 320 of FIGS. 2 and 3 may include SiN, SiON, or $SiO_2$. In this embodiment, F-based etch chemistries such as $SF_6$, $C_2F_6$, $CF_4$, combinations of these, or other suitable chemistries may be used to etch a portion of the insulating layers 220 and 320 that contains the etch stop material. For embodiments that include ITO, $Al_2O_3$, or AlN as the etch stop material in the insulating layers 220 and 320, Cl-based etch chemistries such as Cl, $BCl_3$, combinations of these, or other suitable chemistries may be used to remove the portions of insulating layers 220 and 320 within the partial openings 1520 and 1570. Wet etching may be used instead of or in addition to dry etching, according to an embodiment. Wet etching of SiN, SiON, or $SiO_2$ may accomplished using HF, BOE or other suitable wet etchants, according to an embodiment. Wet etching of ITO may accomplished using a mixture of hydrochloric acid and nitric acid or other suitable wet etchants, according to an embodiment. Wet etching of AlN or $Al_2O_3$ may accomplished using potassium hydroxide (KOH), $NH_4OH$, or other suitable wet etchants, according to an embodiment. In an embodiment, the hard mask 1410 may be removed after etching partial substrate openings 1510 and 1560 and before removing the portion of insulating layers 220 and 320 within the partial substrate opening (not shown). In another embodiment, the hard mask 1410 may be removed before removing the portion of insulating layers 220 and 320 within the partial substrate openings 1510 and 1560 (embodiment not shown). At this point, through-wafer vias 240 and 340 may be formed. Structures 1601 and 1651 result.

Figure 17A:
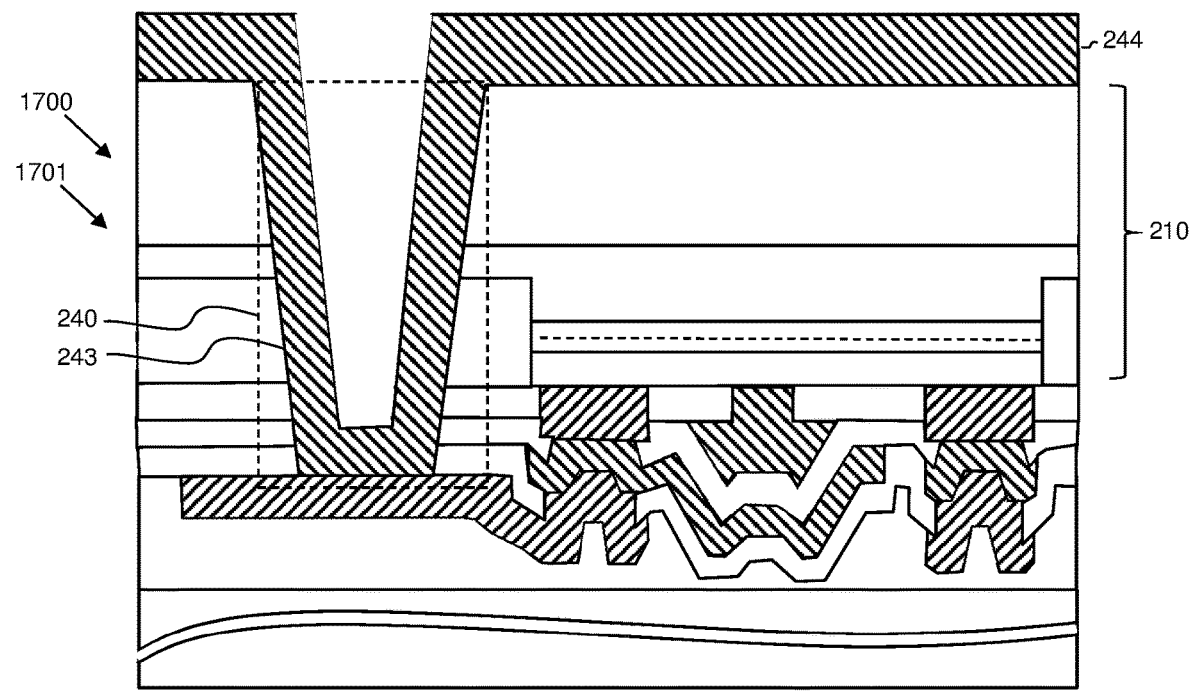
Figure 17B:
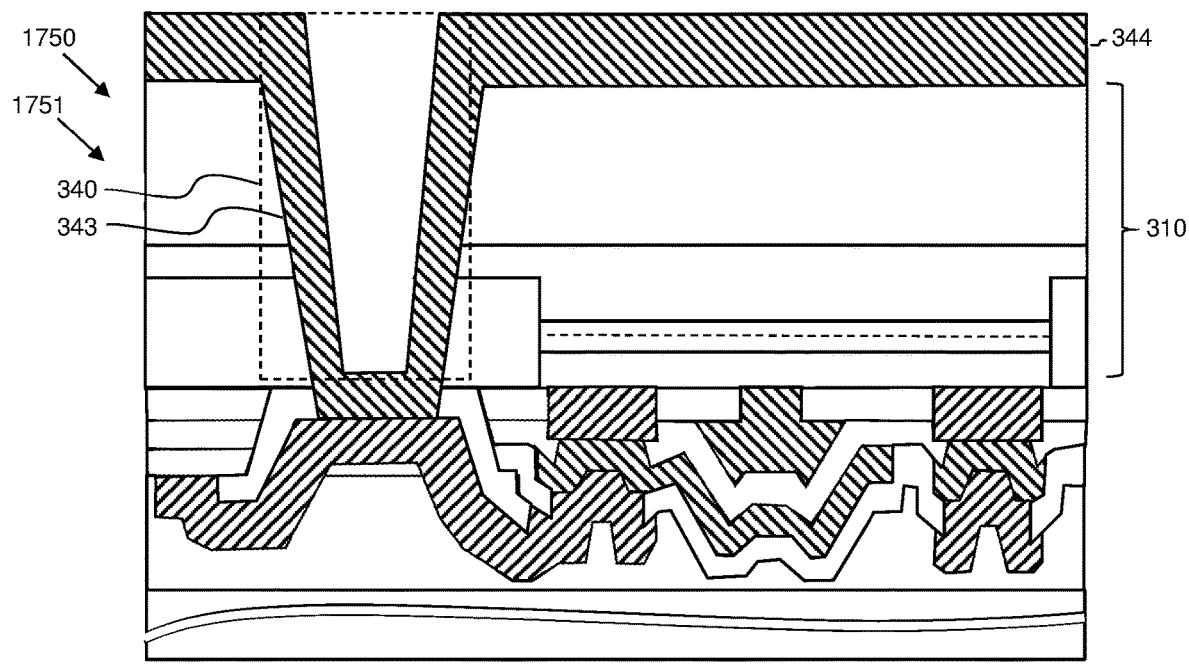

Referring now to FIG. 4, block 460 and FIGS. 17A, 17B and steps 1700 and 1750, respectively, back metal layers 244 and 344 (second conductive regions) may be formed within the through-wafer vias 240 and 340. In an embodiment, the back metal layers 244 and 344 are deposited over the lower substrate surface 211, 311 using a first adhesion layer that contacts lower substrate surface 211, 311 and through-wafer via sidewalls 243, 343 of the through-wafer via 240 and 340, and a second conductive layer that overlies the first adhesion layer. In an embodiment, the adhesion layer may be selected from Ti, Ni, Cr, Ti—W, Au, Cu, Al, a combination of these, or other materials that adhere to the substrates 210, 310. In an embodiment, the adhesion layer may be deposited over the lower substrate surface 211, 311 using one or more of sputtering, evaporation, electro-plating or other suitable technique(s). In an embodiment, the conductive layer may be selected from one of Au, Pd, Cu, Al, tin (Sn), Au—Sn eutectic, a combination of these, or other materials that adhere to the adhesion layer and have sufficient electrical conductivity, thermal conductivity, and solder wetting properties. In an embodiment, the conductive layer may be deposited using one or more of sputtering, evaporation, electro-plating, electro-less plating, or other suitable technique(s). In some embodiments, a diffusion barrier layer may be inserted between the adhesion layer and the conductive layer to prevent solder applied to back metal layers 244 and 344 from consuming the adhesion layer (not shown). The barrier layer may include one of vanadium (V), Ti, Ni, or other suitable materials. The barrier layer may be deposited by sputtering, evaporation, plating, or other suitable technique(s). Structures 1701 and 1751 result.

Figure 18A:
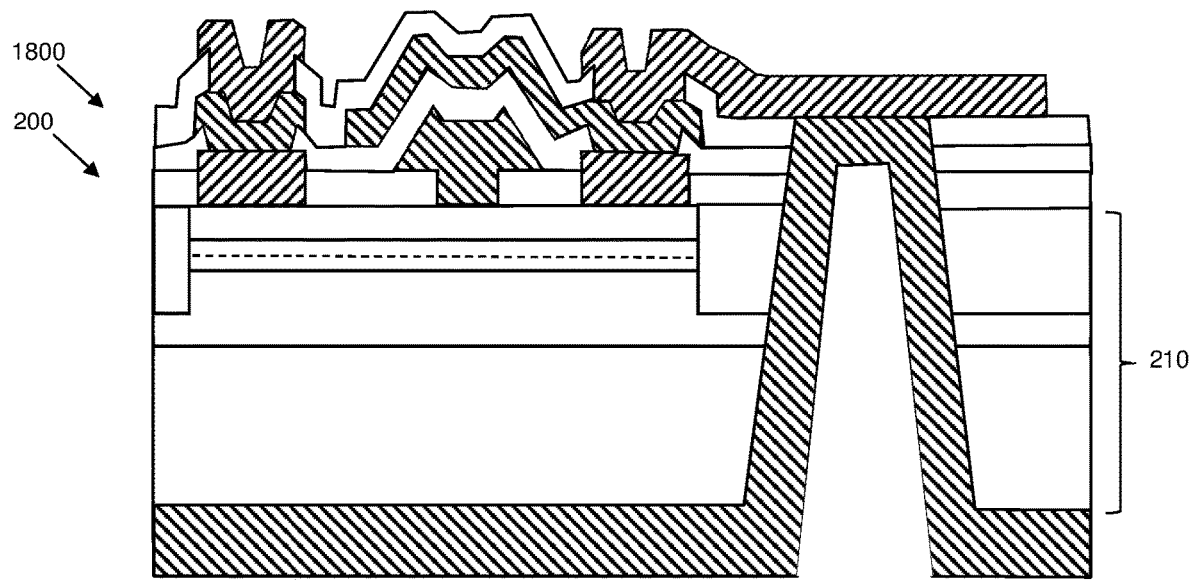
Figure 18B:
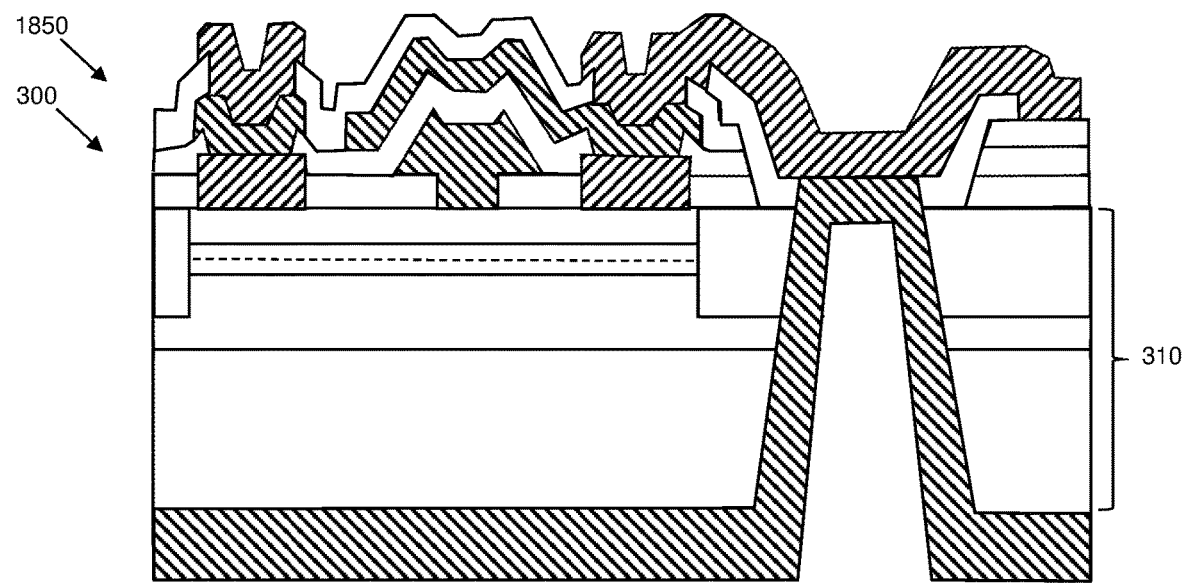

Referring now to FIGS. 18A and 18B and steps 1800 and 1850, the method of fabricating devices 200 and 300 includes immersing structure 1701 and 1751 from FIGS. 17A and 17B in suitable solvents that dissolve adhesive layer 1320, thus separating the substrates 210 and 310 from carrier wafer 1310 of FIG. 13 (not shown). The semiconductor wafer including devices 200 and 300 may then be further processed to singulate devices 200 and 300 from the wafer. The finished devices 200 and 300 result.

The following detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or the following detailed description.

For the sake of brevity, conventional semiconductor fabrication techniques may not be described in detail herein. In addition, certain terminology may also be used herein for reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A device comprising:
    a substrate that includes an upper surface and a lower surface;
    an insulating layer that includes an etch stop layer formed over the upper surface of the substrate, wherein the insulating layer includes a first dielectric layer and a second dielectric layer formed over the first dielectric layer;
    a first conductive region formed over the insulating layer;
    an opening formed within the substrate that extends from the lower surface of the substrate, through the upper surface of the substrate, and through at least a portion the insulating layer, terminating on the first conductive region;
    a second conductive region formed within the opening;
    an active region formed proximate the upper surface of the substrate and laterally adjacent the opening; and
    a first current-carrying electrode formed within the active region and coupled to the active region, and wherein a portion of the insulating layer is formed over at least a portion of a top surface of the first current-carrying electrode.

2. The device of claim 1, wherein a terminating edge of at least a portion of the insulating layer that includes the etch stop layer is formed laterally adjacent the opening and defines a protection region proximate the opening.

3. The device of claim 2, wherein the at least a portion of the insulating layer that includes the etch stop layer is formed outside the active region.

4. The device of claim 1, wherein the etch stop layer includes one or more of aluminum nitride, aluminum oxide, silicon nitride, silicon oxynitride, silicon dioxide, tetraethyl orthosilicate, and indium tin oxide.

5. The device of claim 1, further comprising:
    a second current-carrying electrode formed within the active region, laterally adjacent the first current-carrying electrode, and coupled to the active region.

6. The device of claim 5, further comprising a control electrode formed over the substrate and coupled to the active region between the first current-carrying electrode and the second current-carrying electrode.

7. The device of claim 5, wherein a portion of the insulating layer that includes the etch stop layer is formed over the active region.

8. A device comprising:
    a substrate that includes an upper surface and a lower surface;
    an insulating layer that includes an etch stop layer formed over the upper surface of the substrate;
    wherein:
        the insulating layer includes a first dielectric layer;
        the first dielectric layer includes the etch stop layer; and
        the insulating layer includes a second dielectric layer formed over the first dielectric layer and a third dielectric layer formed over the second dielectric layer;
    a first conductive region formed over the insulating layer;
    an opening formed within the substrate that extends from the lower surface of the substrate, through the upper surface of the substrate, and through at least a portion the insulating layer, terminating on the first conductive region;
    a second conductive region formed within the opening;
    an active region formed proximate the upper surface of the substrate and laterally adjacent the opening; and
    a first current-carrying electrode formed within the active region and coupled to the active region, and wherein a portion of the second dielectric layer is formed over at least a portion of a top surface of the first current-carrying electrode.

9. The device of claim 8, wherein at least a portion of the second dielectric layer is removed within the opening.

10. The device of claim 8, wherein the third dielectric layer includes the etch stop layer.

11. A transistor device comprising:
    a substrate that includes an upper surface and a lower surface;
    an insulating layer that includes an etch stop layer formed over the upper surface of the substrate;
    a first conductive region formed over the insulating layer;
    an opening formed within the substrate that extends from the lower surface of the substrate, through the upper surface of the substrate, and through at least a portion the insulating layer, terminating on the first conductive region formed over the insulating layer;
    a second conductive region formed within the opening;
    an active region formed proximate the upper surface of the substrate and laterally adjacent the opening;
    a first current-carrying electrode formed within the active region and coupled to the active region;
    a second current-carrying electrode formed within the active region, laterally adjacent the first current-carrying electrode, and coupled to the active region, wherein a portion of the insulating layer is formed over at least a portion of a top surface of the second current-carrying electrode; and
    a control electrode formed over the substrate and coupled to the active region between the first current-carrying electrode and the second current-carrying electrode.

12. The transistor device of claim 11, wherein at least a portion of the insulating layer is formed over the active region.

13. The transistor device of claim 11, wherein a portion of the insulating layer that includes the etch stop layer is formed outside the active region.

14. A method of forming a device, the method comprising:
    forming a substrate that includes an upper surface and a lower surface;
    forming an insulating layer that includes an etch stop layer over the upper surface of the substrate;
    forming a first conductive region over the insulating layer;
    forming an opening within the substrate that extends from the lower surface of the substrate, through the upper surface of the substrate, and through at least a portion the insulating layer, terminating on the first conductive region formed over the insulating layer;

forming a second conductive region within the opening;

forming an active region proximate the upper surface of the substrate and laterally adjacent the opening; and forming a first current-carrying electrode within the active region and coupled to the active region, wherein a portion of the insulating layer is formed over at least a portion of a top surface of the first current-carrying electrode.

15. The method of claim 14, the method further comprising forming a second current-carrying electrode within the active region, laterally adjacent the first current-carrying electrode, and coupled to the active region; and forming a control electrode over the substrate and coupled to the active region between the first current-carrying electrode and the second current-carrying electrode.

16. The method of claim 15, wherein the insulating layer includes one or more of aluminum nitride, aluminum oxide, silicon nitride, silicon oxynitride, silicon dioxide, tetraethyl orthosilicate, and indium tin oxide.

17. The method of claim 15, wherein at least a portion of the insulating layer is formed within the active region.

18. The method of claim 17, wherein a terminating edge of the insulating layer is formed outside the active region.

* * * * *